(12) United States Patent
Umetsu et al.

(10) Patent No.: US 6,424,048 B1
(45) Date of Patent: Jul. 23, 2002

(54) SEMICONDUCTOR CHIP, SEMICONDUCTOR DEVICE, CIRCUIT BOARD AND ELECTRONIC EQUIPMENT AND PRODUCTION METHODS FOR THEM

(75) Inventors: Kazushige Umetsu, Chino; Jun Amako, Shiojiri; Shinichi Yotsuya, Chino; Katsuji Arakawa, Suwa, all of (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/601,411

(22) PCT Filed: Dec. 16, 1999

(86) PCT No.: PCT/JP99/07066

§ 371 (c)(1),
(2), (4) Date: Aug. 14, 2000

(87) PCT Pub. No.: WO00/36650

PCT Pub. Date: Jun. 22, 2000

(30) Foreign Application Priority Data

Dec. 16, 1998 (JP) ............................. 10-357245

(51) Int. Cl.$^7$ .................... H01L 29/40; H01L 29/00; H01L 23/02
(52) U.S. Cl. .................. 257/774; 257/507; 257/521; 257/686
(58) Field of Search ............... 257/774, 686, 257/777, 507, 524, 554, 588, 621, 521; 438/219, 295, 355, 404, 629, 637, 639, 640, 667, 668, 672, 675, 700, 701, 713, 978

(56) References Cited

U.S. PATENT DOCUMENTS

| | | | | |
|---|---|---|---|---|
| 5,229,647 A | * | 7/1993 | Gnadinger | 257/785 |
| 6,072,236 A | * | 6/2000 | Akram et al. | 257/698 |
| 6,087,719 A | * | 7/2000 | Tsunashima | 257/686 |

FOREIGN PATENT DOCUMENTS

| | | |
|---|---|---|
| DE | 3233195 | 3/1983 |
| EP | 0 314 437 A1 | 5/1989 |
| JP | 58-43554 | 3/1983 |
| JP | 3-253025 | 11/1991 |
| JP | 4-356956 | 12/1992 |
| JP | 5-063137 | 3/1993 |
| JP | 6-264712 | 9/1994 |
| JP | 8-264712 | 10/1996 |

* cited by examiner

*Primary Examiner*—Jasmine J B Clark
(74) *Attorney, Agent, or Firm*—Oliff & Berridge, PLC

(57) ABSTRACT

A semiconductor chip having a vertical current conduction structure of a high aspect ratio and high reliability: a semiconductor device, a circuit substrate, and an electronic apparatus each containing such semiconductor chips; and a method for producing them. A prehole (3) is formed in a silicon substrate (10) surface-oriented to a (100) face by laser beam irradiation. The prehole (3) is enlarged by anisotropic etching to thereby form a through-hole (4). An electrically insulating film is formed on an inner wall of the through-hole (4). An electrically conducting material is provided inside the insulating film to thereby form a metal bump (30).

24 Claims, 28 Drawing Sheets circular polarization random polarization direction of irradiation with
S polarization (in the case
of rightward bending)

direction of irradiation with
S polarization (in the case
of leftward bending)

Relation between polarization and laser beam absorption factor of Si

Relation between direction of polarization and absorption factor in Si surface laser beam exit plane laser beam incident plane Section x 200 before etching (exit plane)

×200 after etching (exit plane)

×200

Incident plane x 100

Section (section inspection x 100)

exit plane x 100

Number of shots: 50

Number of shots: 500

Number of shots: 5000

Number of shots: 50

Number of shots: 500

Number of shots: 5000

FIG.26 A
FIG.26 B
FIG.26 C
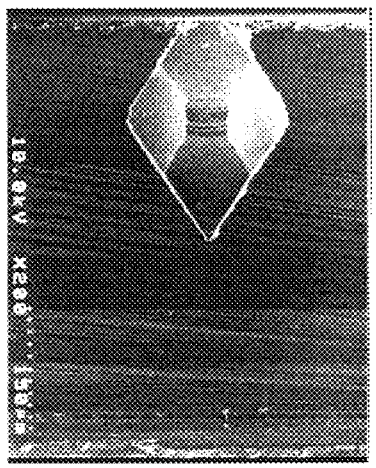
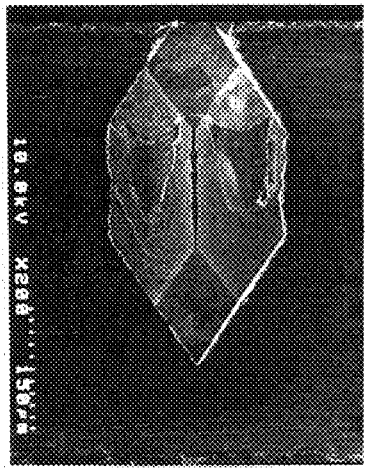
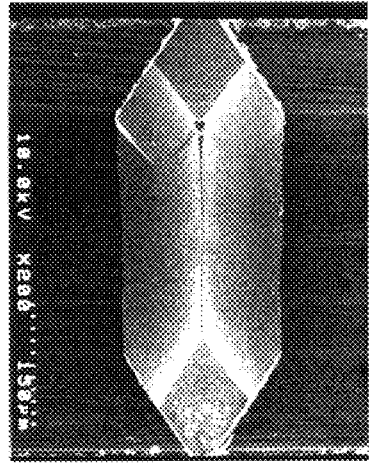
Number of shots: 50
Number of shots: 500
Number of shots: 5000

Number of shots: 50

Number of shots: 500

Number of shots: 5000

Number of shots: 50

Number of shots: 500

Number of shots: 5000

Laser beam does not pierced.

Laser beam pierced.

A-A section

B-B section

A-A section

B-B section

C-C section

A-A section

B-B section

C-C section

SEMICONDUCTOR CHIP, SEMICONDUCTOR DEVICE, CIRCUIT BOARD AND ELECTRONIC EQUIPMENT AND PRODUCTION METHODS FOR THEM

TECHNICAL FIELD

The present invention relates to a semiconductor chip, a semiconductor device containing such semiconductor chips, a circuit substrate in which such a semiconductor device is incorporated, an electronic apparatus in which such a circuit substrate is mounted, and a method for producing them. Particularly, it relates to processing of through-holes for forming metal bumps.

BACKGROUND ART

The development of multimedia and information apparatuses has been remarkable in recent years. The data processing speed of electronic apparatuses has been improved with the advance of reduction in size and weight and increase in capacity. Micro-processors and memories have been improved in performance correspondingly remarkably. The technical progress of their peripheral equipment, however, has lagged relatively. For example, a CPU clock signal having a frequency over 300 MHz has a tendency to generate wiring noise up to a cache memory, malfunction due to signal delay, and unnecessary radiation. There is the present situation that total system performance is limited by the peripheral equipment.

In order to solve such a problem, it is necessary to improve electric characteristics such as crosstalk, signal delay, etc. As one of approaches to the improvement, there has been proposed a method in which LSI chips and component parts arranged two-dimensionally are mounted three-dimensionally on a substrate to shorten the length of wiring between chips to thereby achieve the improvement in electric performance and the improvement in degree of integration per unit area.

For example, such three-dimensional mounting has been proposed in JP-A-8-264712, JP-A-5-63137, etc. In those proposals, three-dimensional mounting was achieved by connecting electrodes of chips to one another through through-holes each containing an electrically conducting material buried therein by piling up semiconductor wafers. How to form the through-holes was, however, unspecified in those proposals though the through-holes were ones each having a hole size of 10 μm and a plate thickness (length) of the order of hundreds of μm.

Laser-processing machining or etching might be conceived for the formation of the through-holes. In the case of laser-processing, however, processing scattered matter (called dross, debris, etc.) was deposited on the neighborhood of the electrodes so that reliability was lowered. Moreover, because it was impossible to make energy per pulse large from the point of view of preventing the substrate from being damaged (breaking or cracking), a large number of pulses were required for the formation of the through-holes. Hence, a long processing time was required. On the other hand, in the case of etching, it was impossible to form a structure of a high aspect ratio because of crystal anisotropy even though an anisotropic etching technique was used.

DISCLOSURE OF THE INVENTION

An object of the present invention is to provide: a semiconductor chip having a vertical current conduction structure of a high aspect ratio and high reliability; a semiconductor device, a circuit substrate, and an electronic apparatus each containing such semiconductor chips; and a method for producing them.

(1) According to an aspect of the present invention, a semiconductor chip comprises: a crystalline substrate having a through-hole prepared by laser beam irradiation and anisotropic etching; an electrically insulating film formed on an inner wall of the through-hole; and a metal bump containing an electrically conducting material inserted into the through-hole, for electrically connecting one surface of the crystalline substrate to the other surface of the crystalline substrate through the electrically conducting material.

(2) According to another aspect of the present invention, the semiconductor chip of the above paragraph (1) further comprises an electrode pad formed on the one surface of the crystalline substrate through an electrically insulating film, wherein the metal bump protrudes from the one surface of the crystalline substrate while being electrically connected to the electrode pad and further protrudes from the other surface of the crystalline substrate while piercing the crystalline substrate.

(3) According to a further aspect of the present invention, in the semiconductor chip of the above paragraph (2), the metal bump is formed in the through-hole which is formed to pierce the crystalline substrate in a range of from a portion of the electrode pad on the one surface of the crystalline substrate to the other surface of the crystalline substrate.

(4) According to a further aspect of the present invention, in the semiconductor chip of the above paragraph (3), the metal bump is made of an electrically conducting material provided along the inner wall of the through-hole.

(5) A semiconductor device according to a further aspect of the present invention includes semiconductor chips described in any one of the paragraphs (1) through (4) in the condition that the semiconductor chips are laminated while the metal bumps of the semiconductor chips are connected to one another.

(6) A circuit substrate according to a further aspect of the present invention includes a semiconductor device described in the paragraph (5).

(7) An electronic apparatus according to a further aspect of the present invention includes a circuit substrate described in the above paragraph (6).

(8) A method of producing a semiconductor chip according to a further aspect of the present invention comprises the steps of: forming a prehole in a crystalline substrate by laser beam irradiation; and enlarging the prehole by anisotropic etching to thereby form a through-hole.

(9) A method of producing a semiconductor chip of the above paragraph (8), according to a further aspect of the present invention, further comprises the steps of: forming an electrically insulating film on an inner wall of the through-hole; and forming an electrically conducting material in the through-hole having the electrically insulated inner wall to thereby form a metal bump for electrically connecting one surface of the crystalline substrate to the other surface of the crystalline substrate.

(10) In a method of producing a semiconductor chip of the above paragraph (9), according to a further aspect of the present invention, the leading hole is formed by laser beam irradiation at a portion of an electrode pad portion formed on the crystalline substrate, and the electrode pad is electrically connected to the metal bump.

(11) In a method of producing a semiconductor chip of the above paragraph (9) or (10), according to a further aspect of the present invention, the crystalline substrate is a silicon substrate.

(12) In a method of producing a semiconductor chip of the above paragraph (11), according to a further aspect of the present invention, the silicon substrate is surface-oriented to a (100) face.

(13) In a method of producing a semiconductor chip of the above paragraph (11), according to a further aspect of the present invention, the silicon substrate is surface-oriented to a (110) face.

(14) In a method of producing a semiconductor chip of any one of the above paragraphs (8) through (13), according to a further aspect of the present invention, protective films are formed on one surface of the crystalline substrate and on the other surface of the crystalline substrate, respectively, so that the crystalline substrate is irradiated with a laser beam through the protective films.

(15) In a method of producing a semiconductor chip of the above paragraph (14), according to a further aspect of the present invention, the silicon substrate is irradiated with a laser beam from a surface of the crystalline substrate on which the electrode pad is formed.

(16) In a method of producing a semiconductor chip of the above paragraph (14), according to a further aspect of the present invention, the silicon substrate is irradiated with a laser beam from a surface of the crystalline substrate which is opposite to the surface on which the electrode pad is formed.

(17) In a method of producing a semiconductor chip of the above paragraph (14), according to a further aspect of the present invention, the silicon substrate is irradiated with a laser beam from a surface of the crystalline substrate on which the electrode pad is formed and from a surface of the same opposite to the surface on which the electrode pad is formed.

(18) In a method of producing a semiconductor chip of the above paragraph (14), according to a further aspect of the present invention, the electrode pad has an opening portion in its center portion and is covered with a protective film so that the laser beam is made to pass through the opening portion across the protective film.

(19) In a method of producing a semiconductor chip of the above paragraph (18), according to a further aspect of the present invention, a patterned protective film is formed between the electrode pad and a surface of the silicon substrate so that the etching form by anisotropic etching is defined by the shape of the protective film.

(20) In a method of producing a semiconductor chip of any one of the above paragraphs (8) through (19), according to a further aspect of the present invention, the substrate is irradiated with a laser beam split by a phase grating.

(21) In a method of producing a semiconductor chip of any one of the above paragraphs (8) through (19), according to a further aspect of the present invention, the substrate is irradiated with a laser beam converted into randomly polarized light.

(22) In a method of producing a semiconductor chip of any one of the above paragraphs (8) through (19), according to a further aspect of the present invention, the crystalline substrate is irradiated with a circularly polarized laser beam.

(23) In a method of producing a semiconductor device according to a further aspect of the present invention, semiconductor chips produced by a production method according to any one of the above paragraphs (8) through (22) are laminated on one another.

(24) In a method of producing a circuit substrate according to a further aspect of the present invention, a semiconductor device produced by a method for producing a semiconductor device according to the above paragraph (23) is incorporated in a circuit substrate.

(25) In a method of producing an electronic apparatus according to a further aspect of the present invention, a circuit substrate produced by a method for producing a semiconductor device according to the above paragraph (24) is mounted on the electronic apparatus.

For example, the present invention has the following advantages in accordance with the aspects thereof.

① There is no limitation due to difficulty of forming a small hole relative to the thickness because a through-hole is formed by anisotropic etching after a prehole has been formed by laser beam irradiation. Hence, a through-hole of a high aspect ratio is obtained.

② Although a long processing time is required when a through-hole is formed only by laser processing, a batch process can be made so that the processing time can be shortened because a prehole is enlarged by anisotropic etching to thereby form a through-hole. Moreover, the diameter of the through-hole little varies and is made uniform.

③ Further, the enlargement of the hole size (hole width) of the through-hole can be adjusted optionally by adjustment of the opening size of a protective film and the time of anisotropic etching.

④ Further, dross produced by laser beam irradiation or processing dust remained on the inner wall is removed automatically when anisotropic etching is performed.

⑤ The surface roughness of the inner wall due to laser processing or the thermal denaturation thereof due to the laser is removed by anisotropic etching so that a smooth crystal face of silicon is exposed. Hence, an electrically insulating film can be formed so securely in the electrically insulating film-forming step that any pinhole cannot be formed in the electrically insulating film. Moreover, the thickness of the electrically insulating film can be set to meet the minimum requirement.

⑥ Protective films are formed on the front and rear surfaces, respectively, of the crystalline substrate so that the crystalline substrate is irradiated with a laser beam through the protective films. The laser beam irradiation is performed from a surface on which the electrode pad is formed, from a surface opposite to the surface on which the electrode pad is formed, or from both the surfaces. Because any place to be etched can be exposed by the laser beam irradiation, the step by photolithography can be omitted so that the cost of production can be reduced. Further, dross produced by the laser beam irradiation is removed when anisotropic etching is performed. Moreover, the aforementioned protective films can serve also as films for protecting various kinds of devices formed in the semiconductor chip when anisotropic etching is performed.

⑦ The electrode pad has an opening portion in its center portion and is covered with a protective film. The laser beam passes through the opening portion of the electrode pad. Hence, the electrode pad is never cut by the laser beam, so that etching the electrode pad is avoided when anisotropic etching is performed.

⑧ A patterned protective film is formed between the electrode pad and the substrate so that the etching form of anisotropic etching is defined by the shape of the protective film. Hence, an optional etching form is obtained in accordance with the shape of the protective film, so that a through-hole having an optional shape is obtained.

⑨ Because the substrate is irradiated with a laser beam split by a phase grating, preholes can be formed in a plurality of places simultaneously. Hence, the processing time can be shortened greatly.

⑩ Because the substrate is irradiated with a laser beam which is circularly polarized, processing bending of the prehole can be suppressed. Hence, unnecessary enlargement of the hole size of the prehole can be suppressed. Further, because the processing bending of the prehole can be suppressed, the positional accuracy of the hole can be improved and the reliability thereof can be improved correspondingly. Moreover, the electrode pad can be small-sized correspondingly. When the circularly polarized laser beam is replaced by a laser beam converted into randomly polarized light, the same effect as described above can be also obtained.

(11) Because the prehole is enlarged by anisotropic etching to thereby form a through-hole after the prehole has been formed in an electrode pad portion of the substrate having the electrode pad on its surface by laser beam irradiation, a predetermined effect (in which a semiconductor chip having a vertical current conduction structure of a high aspect ratio and high reliability can be produced efficiently) is obtained even in the case where the substrate is not crystalline.

(12) Semiconductor chips are laminated onto one another so that a semiconductor device is produced. Hence, the method of producing the semiconductor device involves the aforementioned advantages. Moreover, because an LSI chip can be achieved three-dimensionally, the length of wiring can be shortened so that the electric performance of the LSI chip can be improved (increase in speed, reduction of unnecessary radiant waves and reduction of malfunction). At the same time, the degree of integration per unit area can be improved. Hence, various kinds of electronic apparatuses can be small-sized. Because the semiconductor device is produced by direct lamination of semiconductor chips, the laminate can be shaped not like a pyramid but like a rectangular parallelepiped. Also from this point of view, the degree of integration per unit area can be improved.

BRIEF DESCRIPTION OF THE DRAWINGS

FIGS. 26A, 26B and 26C are diagrams showing sections (cut planes for observation), respectively, showing the states of preholes in the case where etching is applied to each prehole for 60 minutes as Example 6.

BEST MODE FOR CARRYING OUT THE INVENTION

Embodiment 1

Figure 1:
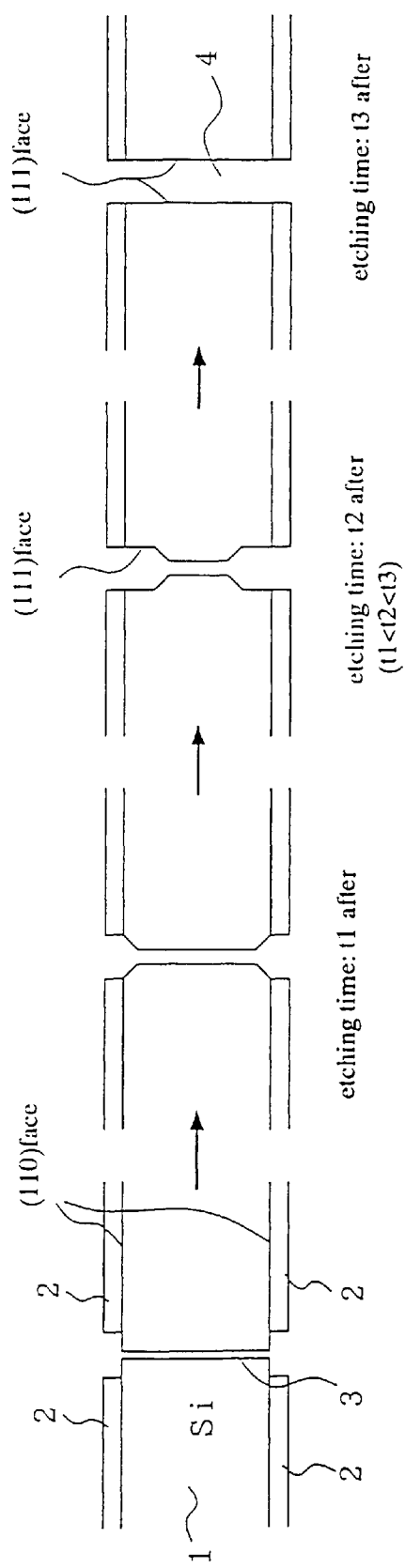
FIGS. 1A and 1B are process charts showing a method (Part 1) of producing a semiconductor according to Embodiment 1 of the present invention and an example for comparison with the method, respectively.
Figure 1:
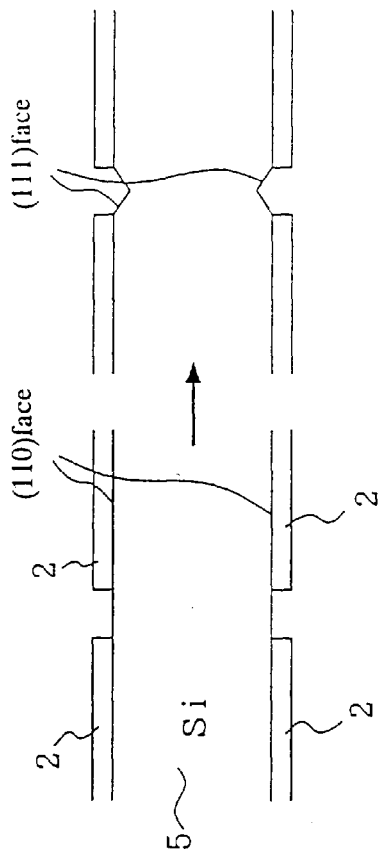

FIG. 1A is a process chart showing a method (Part 1) for producing a semiconductor chip according to Embodiment 1 of the present invention. As shown in FIG. 1A, an oxide film 2 is patterned on a silicon substrate 1 surface-oriented to a (110) face, so that a through-hole (prehole) 3 is formed by a laser beam. When anisotropic etching is then applied thereto, the etching advances until the etching stops with appearance of a surface-oriented (111) face. Thus, a through-hole 4 of a high aspect ratio as shown in FIG. 1A is formed.

However, if only anisotropic etching is applied as shown in FIG. 1B by way of comparative example, the etching stops in the surface-oriented (111) face (at an angle of 35.4 degrees with respect to the surface). Accordingly, if the relation between plate thickness t and opening L is t>0.7L approximately, such a through-hole cannot be formed.

Figure 2:
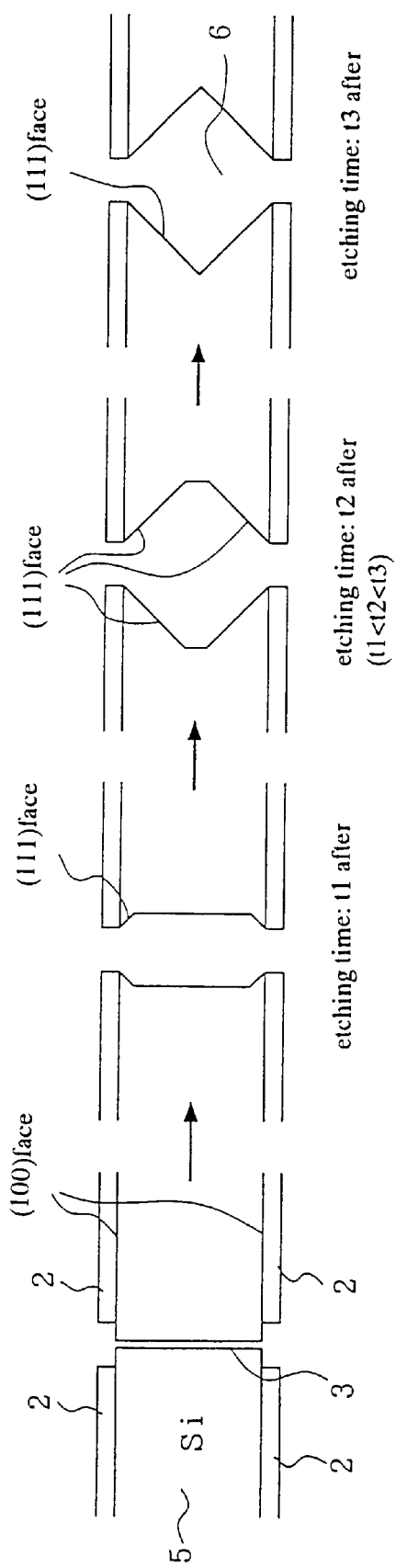
FIGS. 2A and 2B are process charts showing a method (Part 2) of producing a semiconductor according to Embodiment 1 of the present invention and an example for comparison with the method, respectively.
Figure 2:
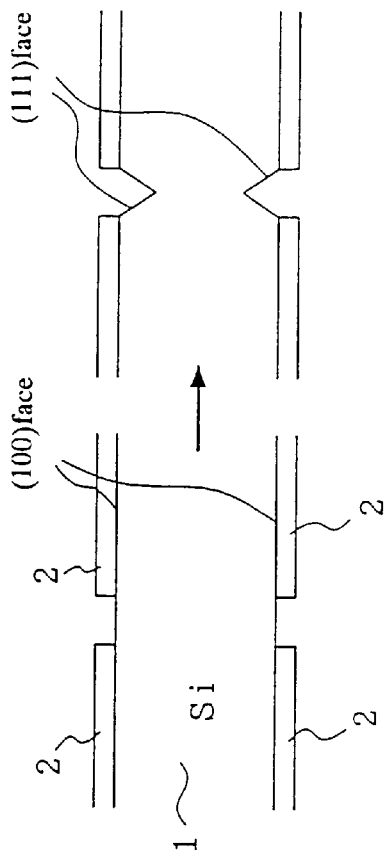

FIG. 2A is a process chart showing a method (Part 2) for producing a semiconductor chip according to Embodiment 1 of the present invention. As shown in FIG. 2A, an oxide film 2 is patterned on a silicon substrate 5 surface-oriented to a (100) face, so that a through-hole 3 is formed by a laser beam. When anisotropic etching is then applied thereto, the etching advances until the etching stops with appearance of a surface-oriented (111) face. Thus, a through-hole 6 of a high aspect ratio as shown in FIG. 2A is formed.

However, if only anisotropic etching is applied as shown in FIG. 2B by way of comparative example, the etching stops in the surface-oriented (111) face (at an angle of 54.7 degrees with respect to the surface). Accordingly, if the relation between plate thickness t and opening L is t>1.4L approximately, such a through-hole cannot be formed.

Incidentally, in FIGS. 1A and 2A, etching stops just at a crystal face. This shows that a crystallinity deteriorated portion is removed by laser beam irradiation. In other words, this shows that any other portions (for example, device portions) than the through-hole are not deteriorated.

Figure 3:
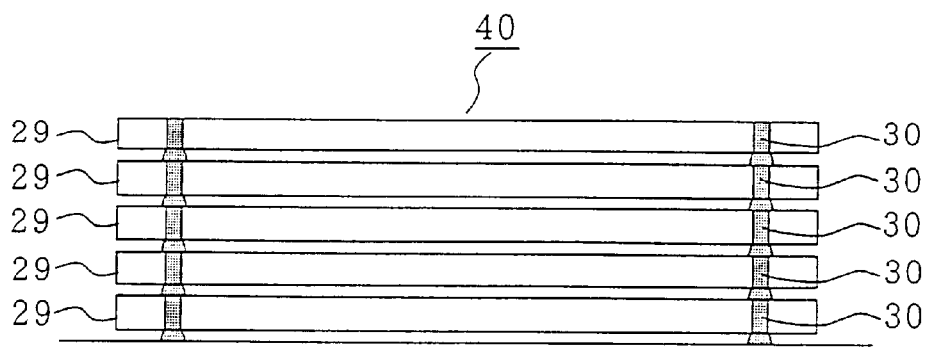
FIG. 3 is a front view of a semiconductor device according to the present invention.

FIG. 3 is a front view of a semiconductor device 40 according to the present invention. The semiconductor device 40 is formed from semiconductor chips 29 laminated as shown in FIG. 3. Incidentally, in the semiconductor device 40, the semiconductor chips 29 are laminated so as to be electrically connected to one another through metal bumps 30. In this respect, the semiconductor device 40 is different from a device in which semiconductor chips are arranged on opposite surfaces of a lead frame. The semiconductor chips 29 are constituted by storage devices such as DRAM, SRAM, flash memory, or the like, logic circuits, and so on. By laminating the same kind of or different kinds of semiconductor chips 29, for example, a system LSI can be formed.

Figure 4:
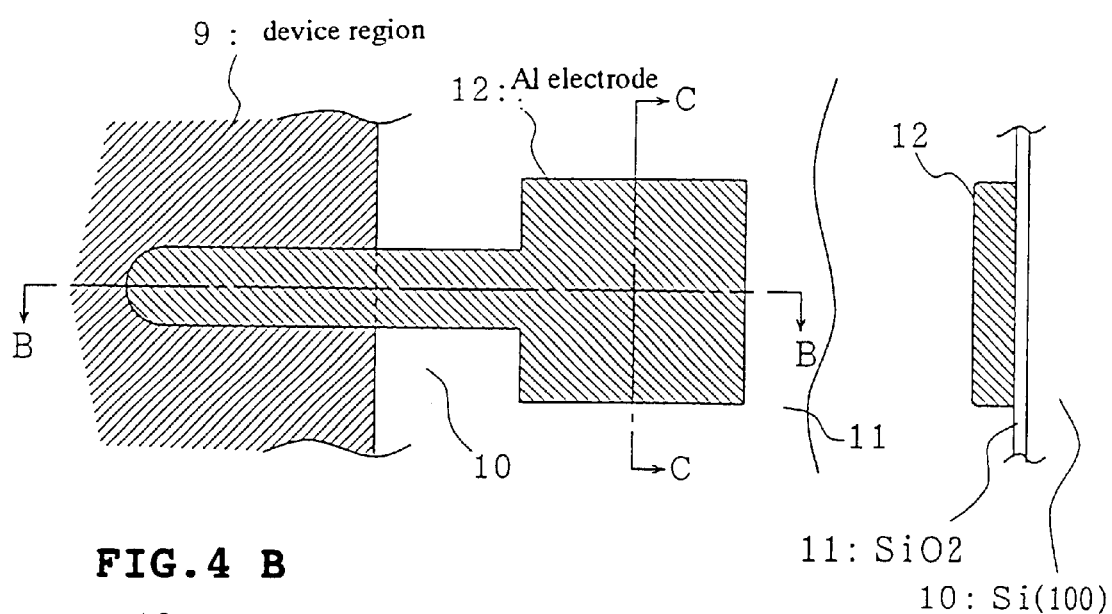
FIGS. 4A to 4C are explanatory diagrams of a silicon substrate having a surface in which various kinds of devices are formed.
Figure 4:
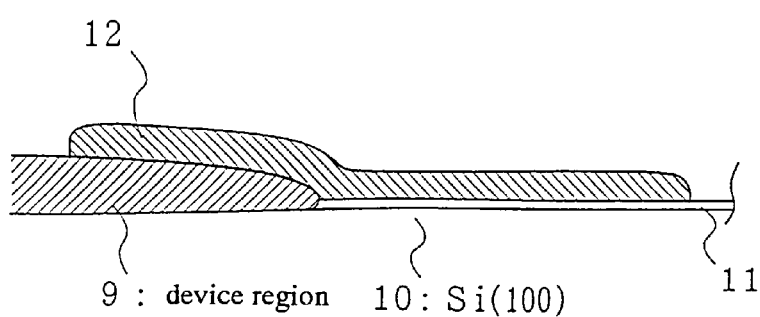

FIG. 4A is a partial plan view of a semiconductor chip in the middle of production. FIG. 4B is a sectional view taken along the line B—B in FIG. 4A. FIG. 4C is a sectional view taken along the line C—C in FIG. 4A. A device region 9 containing a transistor, a resistor element, wiring, etc. and an aluminum film 12 as an electrode pad are formed on a silicon substrate 10 surface-oriented to a (100) face. The aluminum film 12 is formed on the silicon substrate 10 through an oxide film 11 and electrically connected to the device region 9.

Figure 5:
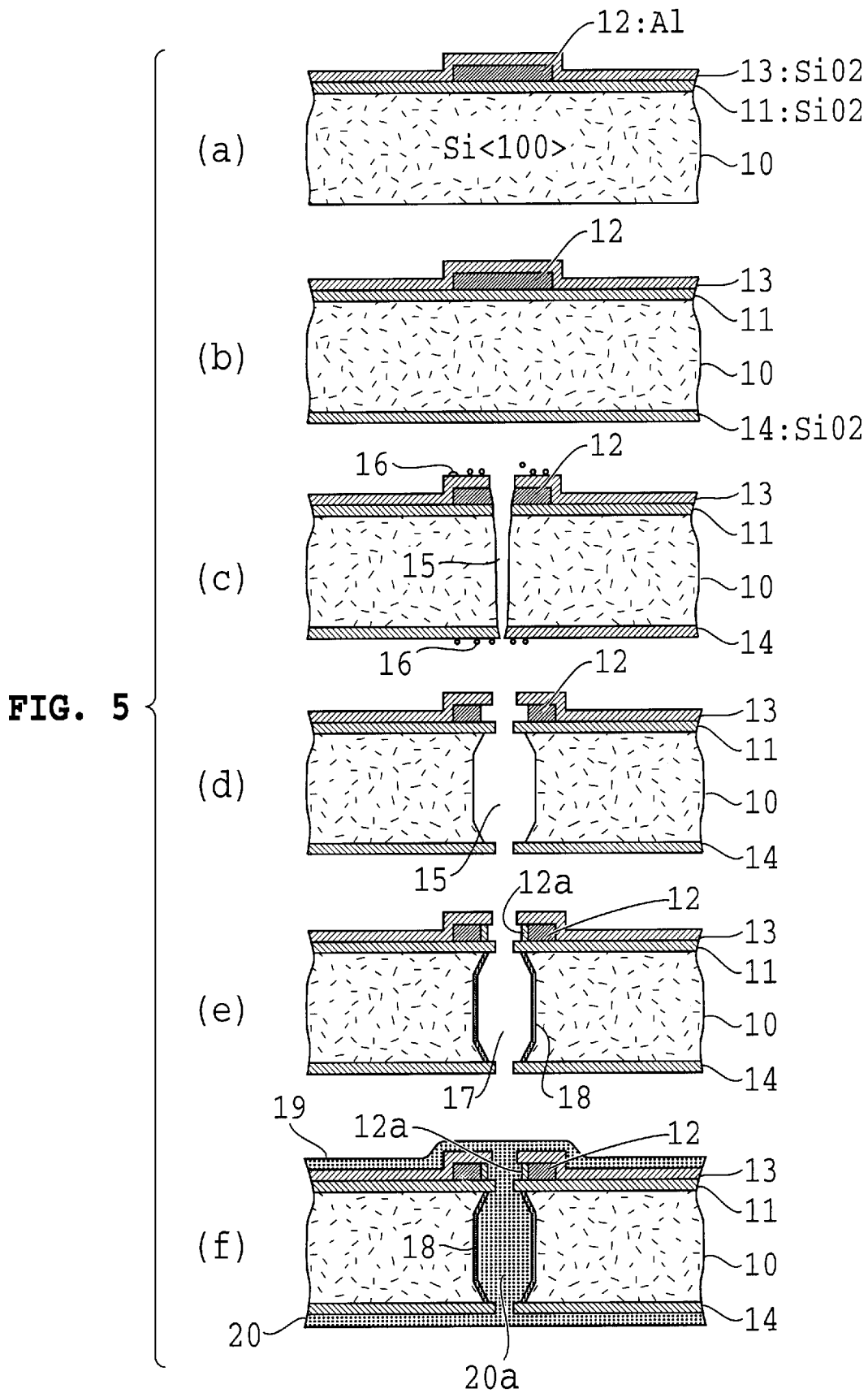
FIG. 5 is a process chart (Part 1) of a method for producing the semiconductor device depicted in FIG. 3.
Figure 6:
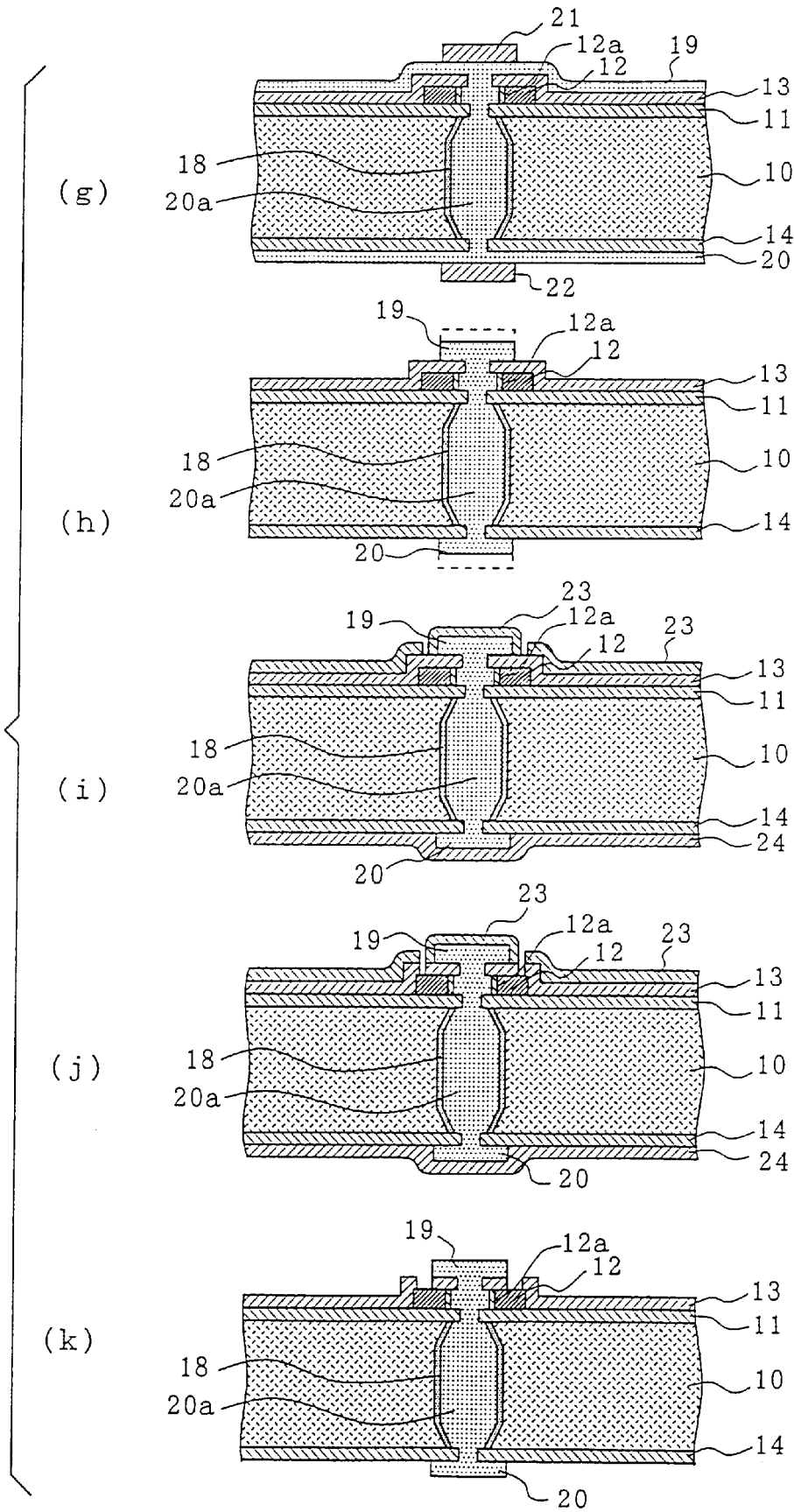
FIG. 6 is a process chart (Part 2) of a method for producing the semiconductor device depicted in FIG. 3.
Figure 7:
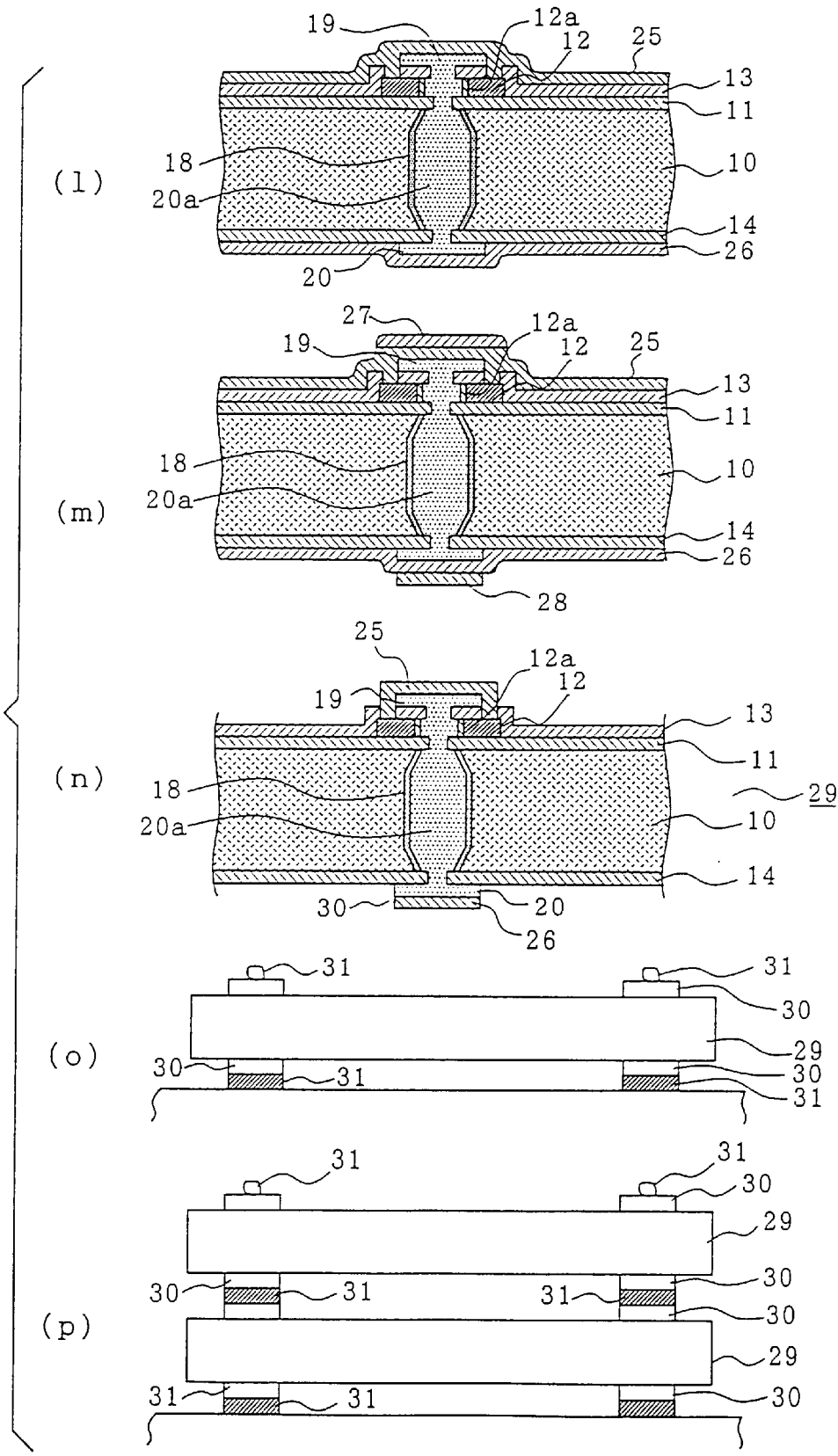
FIG. 7 is a process chart (Part 3) of a method for producing the semiconductor device depicted in FIG. 3.

FIGS. 5 to 7 are process charts of a method for producing the semiconductor device depicted in FIG. 3. The method for producing the semiconductor device will be described with reference to the process charts.

(a) A silicon oxide film 13 which serves as an anti-Si etching film is formed on the aluminum film 12 in the silicon substrate 10 surface-oriented to the (100) face in a state shown in FIGS. 4A to 4C by a CVD method (or a PVD method). Although here is shown the case where the silicon oxide film 13 is used, the oxide film is not limited thereto so long as the oxide film has characteristic of an anti-Si etching film. For example, a silicon nitride film can be also used. The same applies also to the next step (b).

(b) A silicon oxide film 14 is formed also on a rear surface of the silicon substrate 10 by a CVD method (or a PVD method) in the same manner as described above. Incidentally, grinding, or the like, of the rear surface may be performed in the previous step so that the substrate itself can be made thinner.

(c) A prehole 15 piercing the aluminum film 12 is formed in the silicon substrate 10 by laser beam irradiation. On this occasion, dross 16 is produced in the neighborhood of a laser beam incident portion and a laser beam exit portion. The condition, or the like, for the laser beam will be described in connection with the examples which will be described later.

(d) The diameter of the prehole 15 is enlarged by anisotropic etching. At the same time, the diameter of the hole formed in the aluminum film 12 by laser beam irradiation is also enlarged (moved back) by the etching. The condition for the anisotropic etching will be described in the examples which will be described later.

(e) On an inner wall of the hole 17 formed by the anisotropic etching, a silicon oxide film 18 is formed by a CVD method (or a PVD method). At the same time, an oxide film 12a is also formed on an inner wall of the hole in the aluminum film 12. It is preferable from the point of view of coverage that silicon oxide is formed from the opposite surfaces. Incidentally, in Embodiment 1, the processing step of FIG. 6(i) and the steps after the step of FIG. 6(i) are required for the oxide film 12a. Any material may be used for the oxide film 12a so long as the oxide film 12a has electrically insulating characteristic. The oxide film 12a may be replaced by silicon nitride, polyimide, Teflon, or the like. In consideration of propagation delay characteristic, however, a material low in dielectric constant is preferred.

(f) Copper plating is applied so that copper plating layers 19 and 20 are formed on the front and rear surfaces, respectively, of the silicon substrate 10. At the same time, the hole 17 having its inner wall covered with the silicon oxide film 18 is filled with a copper plating material 20a.

(g) Photo resists 21 and 22 are formed on the copper plating layers 19 and 20, respectively, by photolithography.

(h) In the copper plating layers 19 and 20, portions except the portions covered with the photo resists 21 and 22 are removed by photo etching.

(i) Resists 23 and 24 are formed by photolithography. The resist 23 is formed so that a portion of the silicon oxide film 13 located on the aluminum film 12 is exposed to the outside.

(j) The silicon oxide film 13 exposed to the outside is removed by dry etching. A portion of the silicon oxide film 13 is left on the aluminum film 12 by the dry etching (this portion is represented by the reference numeral 12a).

(k) The resists 23 and 24 are peeled.

(l) Copper plating (electroless) is applied to the whole surface so that copper plating layers 25 and 26 are formed.

(m) Resists 27 and 28 are formed on the copper plating layers 25 and 26 respectively.

(n) The copper plating layers 25 and 26 except the copper plating layers 25 and 26 located in the inside of the resists 27 and 28 are removed by photo etching. A semiconductor chip (IC chip) 29 is produced by the aforementioned processes.

(o) Solder 31 or gold is deposited on metal bumps 30 each composed of the copper plating layers 19 and 25, the copper plating material 20a and the copper plating layers 20 and 26. Incidentally, the solder 31 may be replaced by an anisotropic electrically conducting film (ACF), a ball bump, an electrically conducting adhesive agent, or the like.

(p) A semiconductor chip 29 formed in the same manner as described above is placed on the solder 31 and fusion-bonded. The semiconductor device 40 having a multi-layer structure shown in FIG. 3 is obtained by repeating the aforementioned processes Although the above description has been made upon the silicon substrate 10 surface-oriented to a (100) face, the above description can be applied also to a silicon substrate surface-oriented to a (110) face. Although the above description has been made upon the case where the silicon substrate 10 is irradiated with a laser beam from a front surface of the silicon substrate 10 when the prehole is formed, the invention may be applied also to the case where the silicon substrate is irradiated with a laser beam from a rear surface of the silicon substrate. In this case, the hole size in the front surface is reduced so that the size of the metal bumps can be reduced.

Embodiment 2

Figure 8:
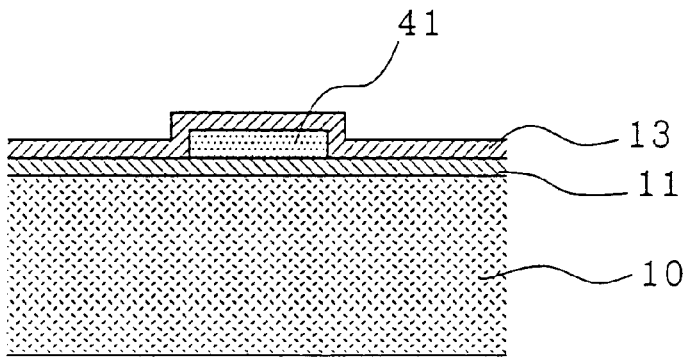
FIG. 8 is a process explanatory diagram for Embodiment 2 of the present invention.

FIG. 8 is a process explanatory diagram for Embodiment 2 of the present invention. FIG. 8 corresponds to FIG. 5(a). In Embodiment 2, a gold film 41 is used as the electrode pad. Because the oxide film 12a in FIG. 5(d) in Embodiment 1 is not formed on the gold film 41, the process steps of FIG. 6(i) to FIG. 7(n) are not required in Embodiment 2.

Embodiment 3

Figure 9:
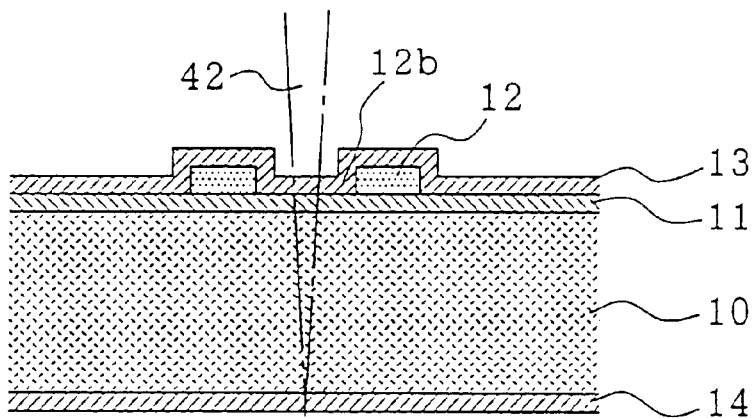
FIG. 9 is a process explanatory diagram for Embodiment 3 of the present invention.

FIG. 9 is a process explanatory diagram for Embodiment 3 of the present invention. FIG. 9 corresponds to FIGS. 5(b) and (c). In Embodiment 3, a hole 12b is provided in the center portion of the aluminum film 12 in advance. Because the hole 12b is provided in the aluminum film 12 as described above, the hole is not moved back at the time of irradiation with a laser beam 42. Moreover, because the aluminum film 12 is covered with silicon oxide films 11 and 13, the aluminum film 12 is not etched (moved back) at the time of anisotropic etching. Moreover, the oxide film 12a is not caused when the silicon oxide film 18 is formed. Hence, also in Embodiment 3, the process steps of from FIG. 6(i) to FIG. 7(n) are not required.

Embodiment 4

Figure 10:
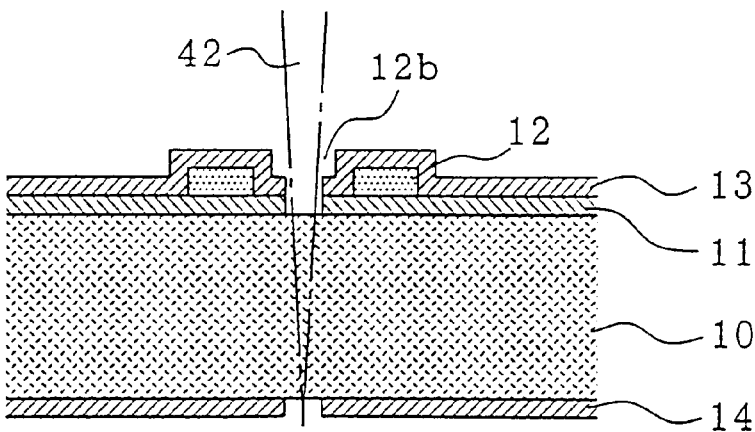
FIG. 10 is a process explanatory diagram for Embodiment 4 of the present invention.

FIG. 10 is a process explanatory diagram for Embodiment 4 of the present invention. FIG. 10 corresponds to FIG. 5(a). In Embodiment 4, a hole 12b is provided in advance in the center portion of the aluminum film 12 in the same manner as in the case of FIG. 9 and the silicon oxide film 11 is patterned so that a portion of the silicon substrate 10 is exposed. By this measure, retreating of the aluminum film 12 is avoided and the etching pattern (the shape of the through-hole) at anisotropic etching is standardized.

Embodiment 5

Figure 11:
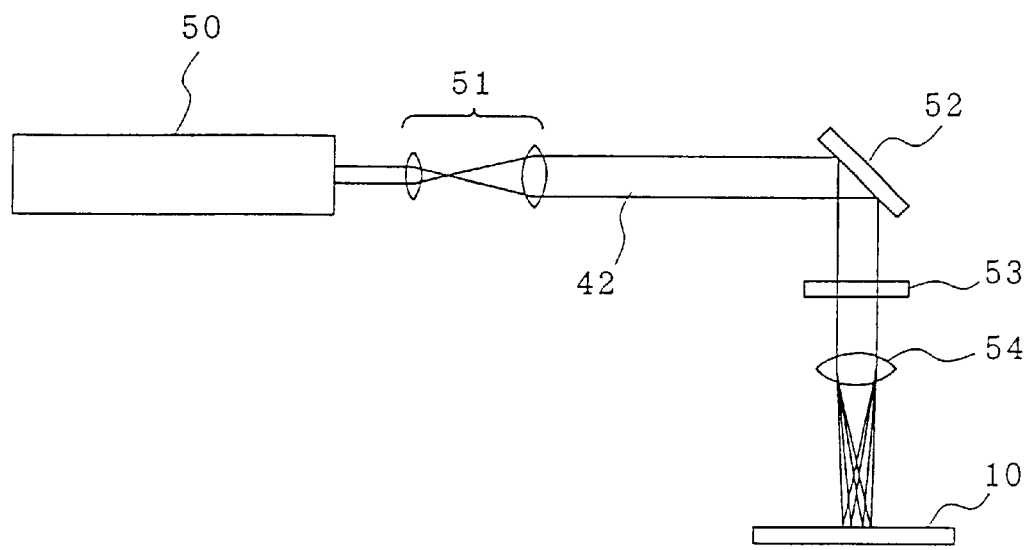
FIG. 11 is a diagram showing an explanatory construction of an apparatus used in the case where preholes are formed in the silicon substrate by a laser beam in each of the aforementioned embodiments.

FIG. 11 is a diagram showing the construction of an apparatus in the case where preholes 15 are formed in the silicon substrate 10 by a laser beam in each of the aforementioned embodiments. Laser beam 42 from a laser beam source 50 passes through a beam expander 51 and a reflection mirror 52 and reaches a phase grating 53. Then, the laser beam 42 is splitted by the phase grating 53, so that the silicon substrate 10 is irradiated with light parts.

Figure 12:
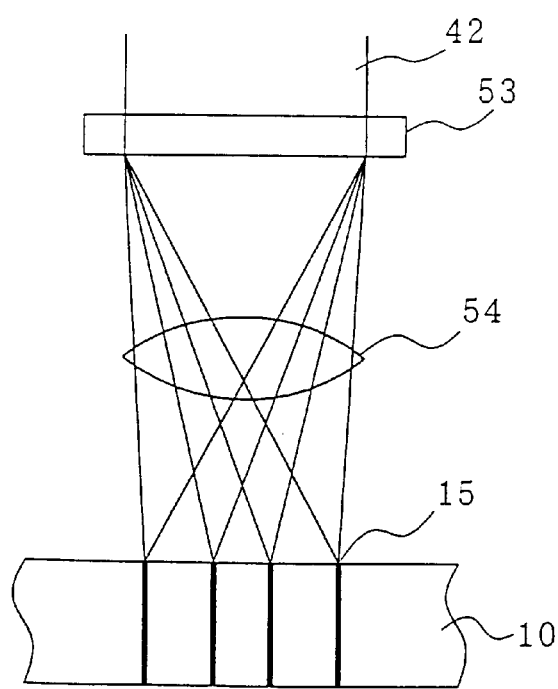
FIGS. 12A and 12B are explanatory diagrams showing a state of processing by the apparatus depicted in FIG. 11.
Figure 12:
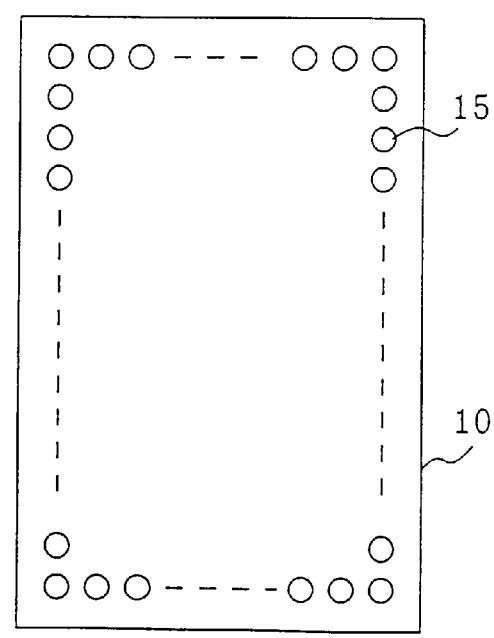

FIGS. 12A and 12B are explanatory diagrams, respectively, showing a state in this occasion. In this case, the silicon substrate 10 is irradiated with the laser beam 42 divided into four light parts by the phase grating 53, so that preholes 15 are formed in the silicon substrate 10. The ramification may be performed, for example, by splitting the laser beam in an X direction first and then splitting the laser beam in a Y direction while changing the direction (by moving the phase grating 53 relative to the silicon substrate 10). Or the laser beam may be splitted in the X direction and in the Y direction simultaneously by the phase grating 53. Because a plurality of preholes 15 can be formed simultaneously in the aforementioned manner, the processing time can be shortened. Moreover, two-dimensional ramification can be made. In this case, one chip or one wafer can be also processed in batch.

Embodiment 6

Figure 13:
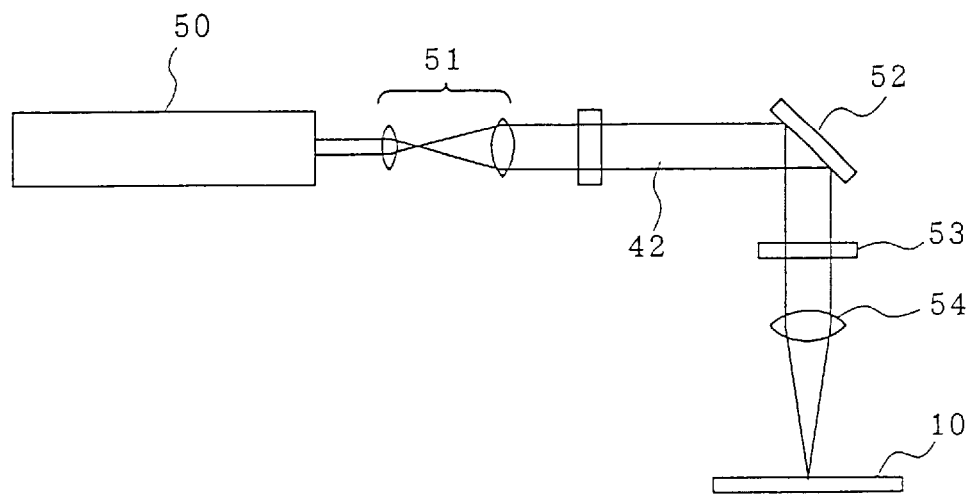
FIG. 13 is a diagram showing another examplary construction of the apparatus used in the case where preholes are formed in the silicon substrate by a laser beam in each of the aforementioned embodiments.

FIG. 13 is a diagram showing the construction of an apparatus in the case where a preholes 15 are formed in the silicon substrate 10 by a laser beam in each of the aforementioned embodiments. In FIG. 13, a $\lambda/4$ polarizing plate 56 is provided on the light exit side of the beam expander 51 so that a laser beam 42 is circularly polarized.

Figure 14:
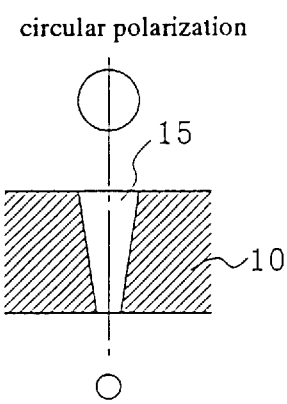
FIGS. 14A to 14D are explanatory diagrams showing states of the prehole in the case where the laser beam is circularly polarized, in the case where the laser beam is randomly polarized and in the case where the laser beam is linearly polarized (S-polarized) by the apparatus depicted in FIG. 13.
Figure 14:
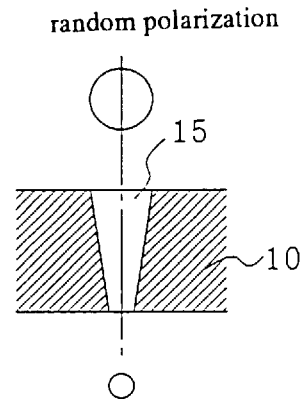
Figure 14:
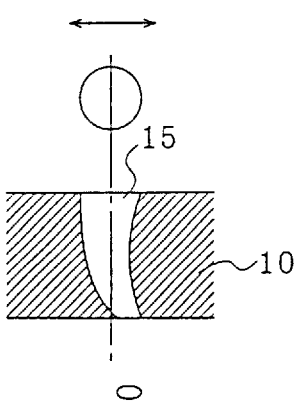
Figure 14:
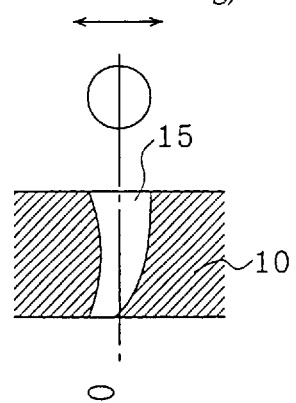

FIG. 14A is an explanatory diagram showing the state of a preformed hole in the case where a laser beam is circularly polarized by the apparatus depicted in FIG. 13. FIG. 14B is an explanatory diagram showing the state of a preformed hole in the case where a laser beam is randomly polarized. It is apparent that the prehole 15 is formed straightly without being bent as shown in the drawings. FIGS. 14C and 14D are explanatory diagrams, respectively, showing the state of a preformed hole in the case where a laser beam is linearly polarized. It is apparent that the prehole 15 is bent and distorted as shown in the drawings. This is conceived to be a phenomenon caused by difference in absorption factor between P polarization and S polarization with respect to the inner wall (see FIGS. 15A and 15B). It is, hence, conceived that, when processing is accelerated while being once biased to any direction, the bias is further accelerated by a light guide effect of the through-hole. On the contrary, when a laser beam is randomly polarized or when a laser beam is circularly polarized, the phenomenon that the through-hole is bent can be suppressed effectively because the substrate is randomly irradiated with S-polarized light or P-polarized light and because there is no bias in S-polarized light or P-polarized light.

Figure 15:
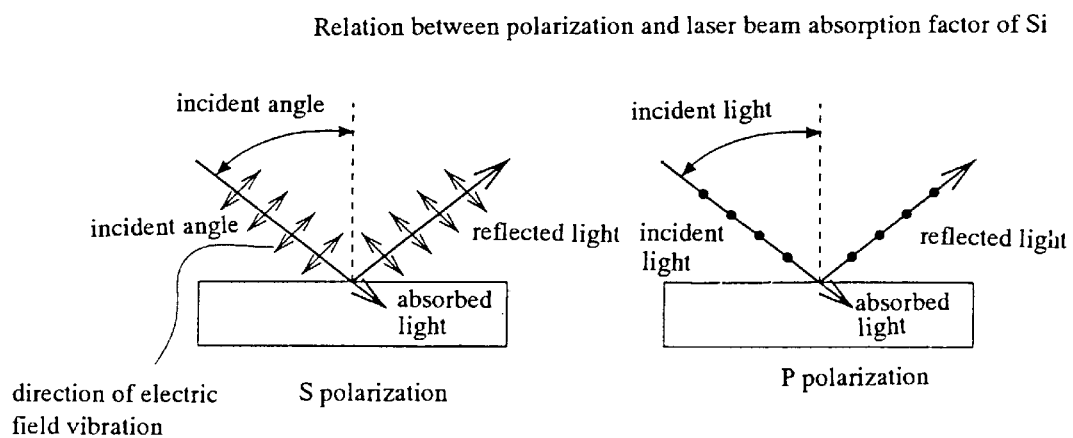
FIGS. 15A and 15B are diagrams showing the relation between polarization and the laser beam-absorption factor of Si.
Figure 15:
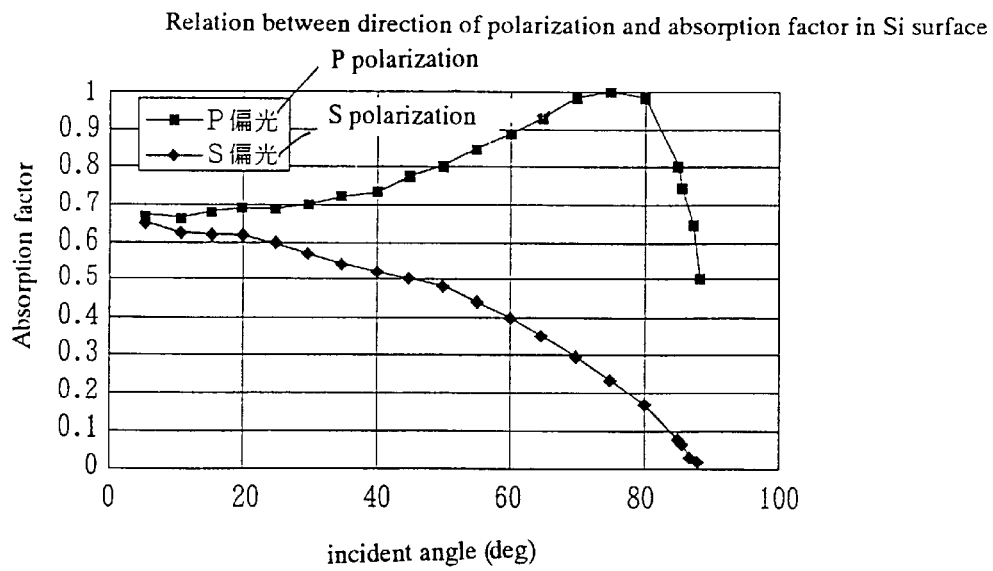

FIGS. 15A and 15B show the relation between linear polarization and the laser beam absorption factor of Si. From these drawings, the absorption factor in P polarization is higher than that in S polarization (especially at about 80°). It is, hence, conceived that the possibility of bending becomes high in the case of linearly polarized light.

Embodiment 7

Although each of the aforementioned embodiments has been described upon the case where perpendicular holes are formed in a silicon substrate by laser-processing and etching, the present invention is not limited thereto but may be applied also to the case where oblique holes are formed by laser-processing. Specific examples thereof are shown in detail in FIGS. 30 to 37. When such an oblique hole is produced in a silicon substrate surface-oriented to a (100) face by laser-processing, the following advantages are obtained as in the case of a silicon substrate surface-oriented to a (110) face.

The pitch between holes can be further reduced because straight holes without spreading in the inside can be formed.

The hole width need not be controlled by the etching time because the hole width can be set to be the same as the size of the oxide film.

The hole shape does not vary because the sectional shape of the hole can be defined by the (111) face for surface orientation.

Embodiment 8

Figure 16:
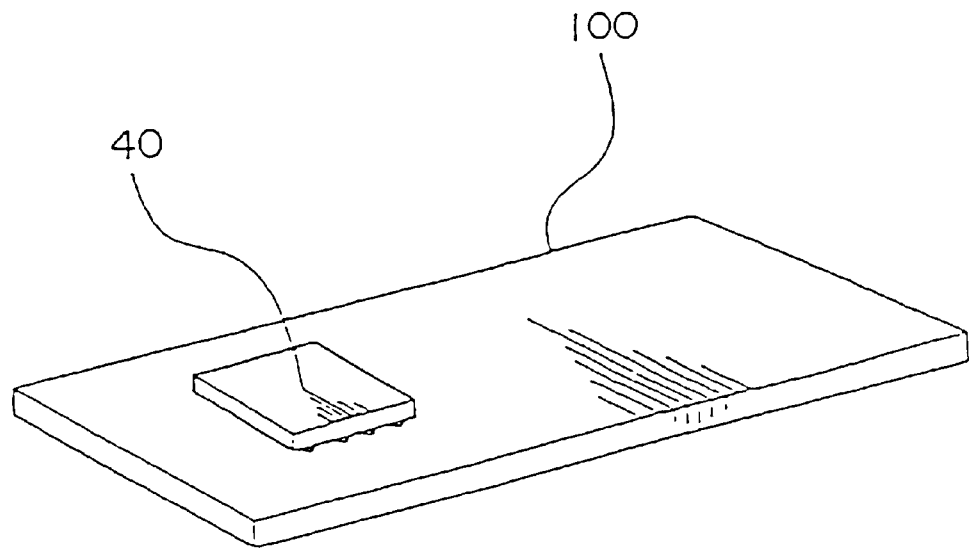
FIG. 16 is an explanatory diagram of a circuit substrate having mounted thereon a semiconductor device according to the aforementioned embodiments.
Figure 17:
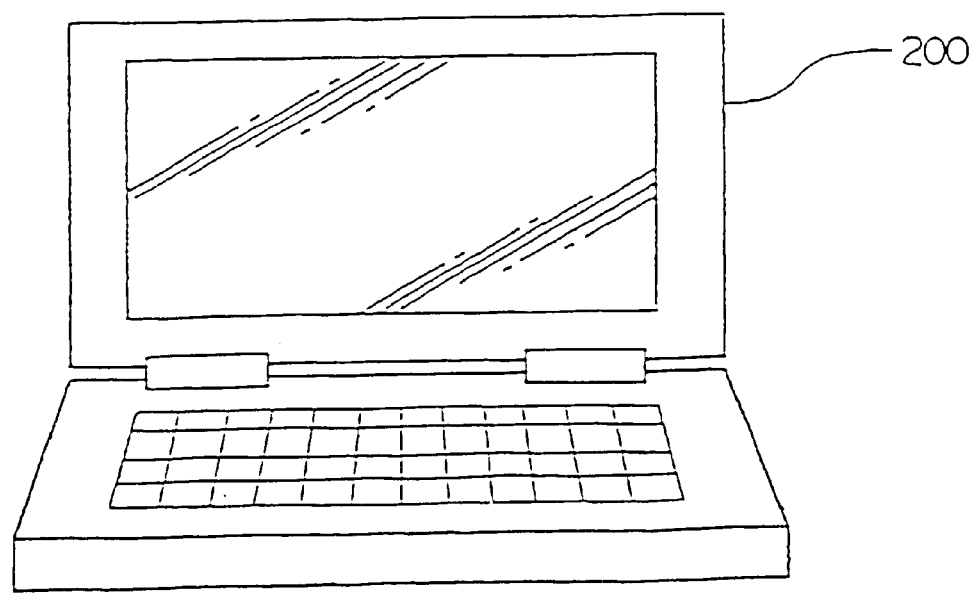
FIG. 17 is a perspective diagram of a notebook-type personal computer incorporating the circuit substrate depicted in FIG. 16.
Figure 18:
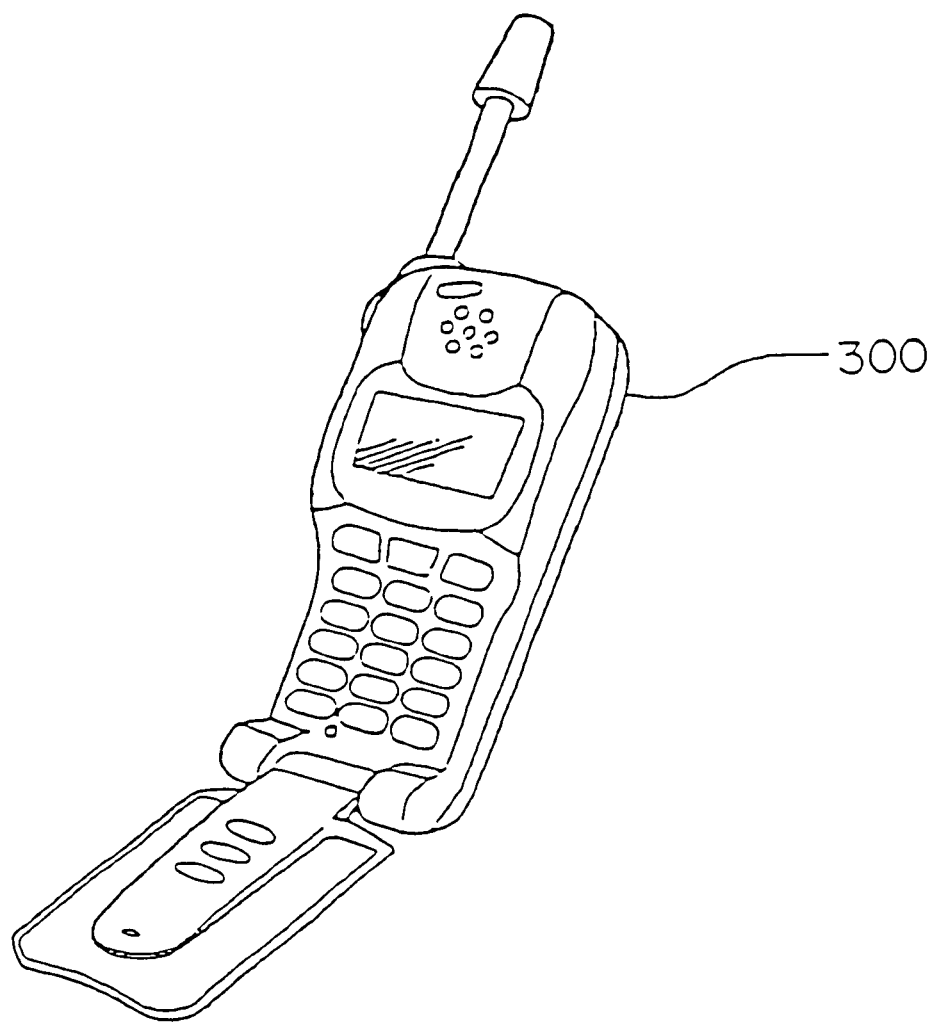
FIG. 18 is a perspective diagram of a portable telephone set incorporating the circuit substrate depicted in FIG. 16.

FIG. 16 is an explanatory diagram of a circuit substrate on which a semiconductor device according to the aforementioned embodiments are mounted. An organic substrate such as a glass epoxy resin substrate is generally used as a circuit substrate 100. Wiring patterns, for example, made of copper, or the like, are formed in the circuit substrate 100 so as to form a desired circuitry. These wiring patterns are mechanically connected to external terminals of the aforementioned semiconductor device 40 so that electrical connection between the wiring patterns and the external terminals is achieved. FIG. 17 shows a notebook-type personal computer 200 as an electronic apparatus incorporating the circuit substrate 100. FIG. 18 shows a portable telephone set 300 as an electronic apparatus incorporating the circuit substrate 100.

Specific examples of the aforementioned embodiments will be described below.

EXAMPLE 1

Figure 19:
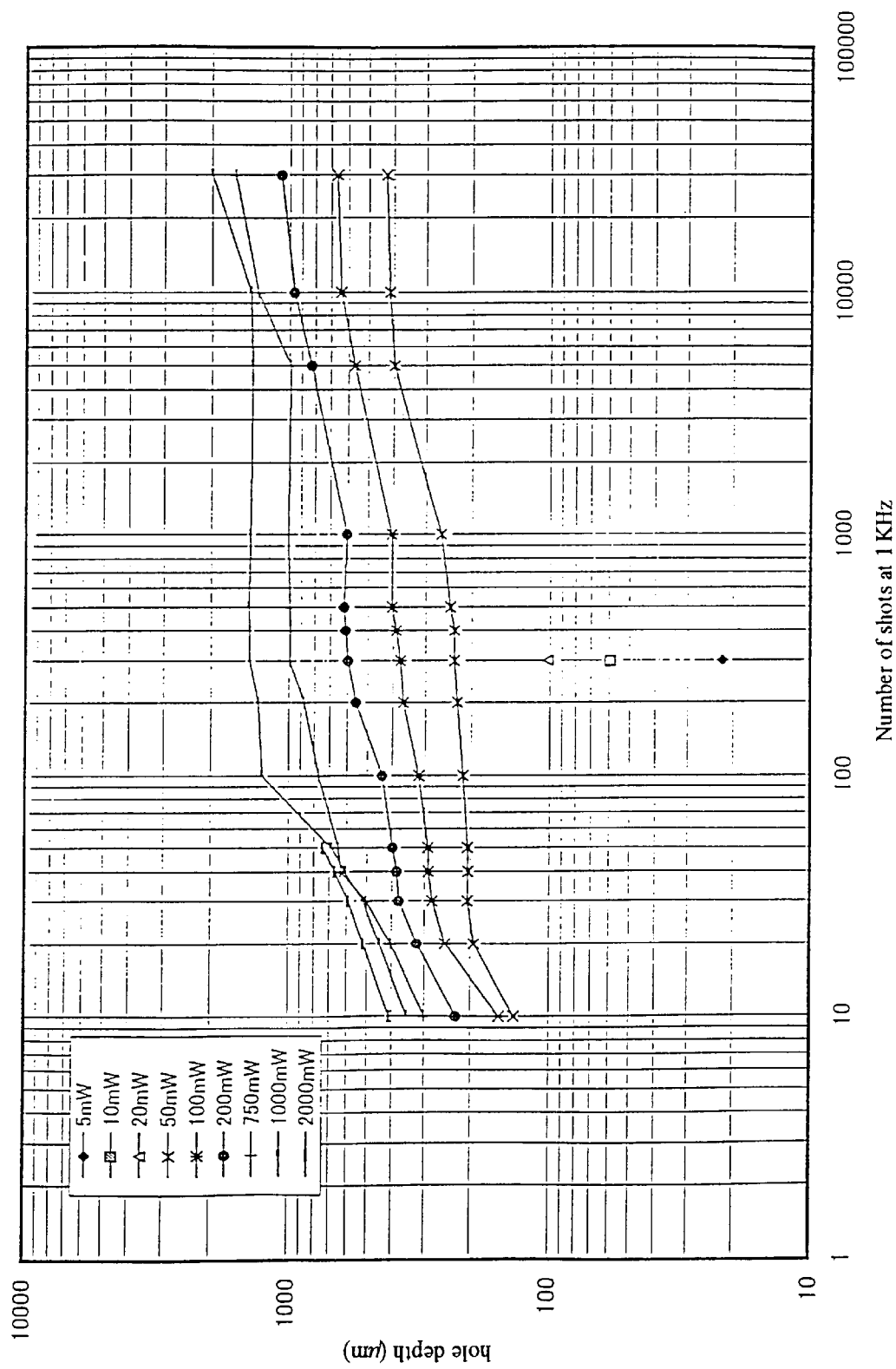
FIGS. 19 and 20 are characteristic diagrams in the case where the preholes are formed by laser beam irradiation.
Figure 20:
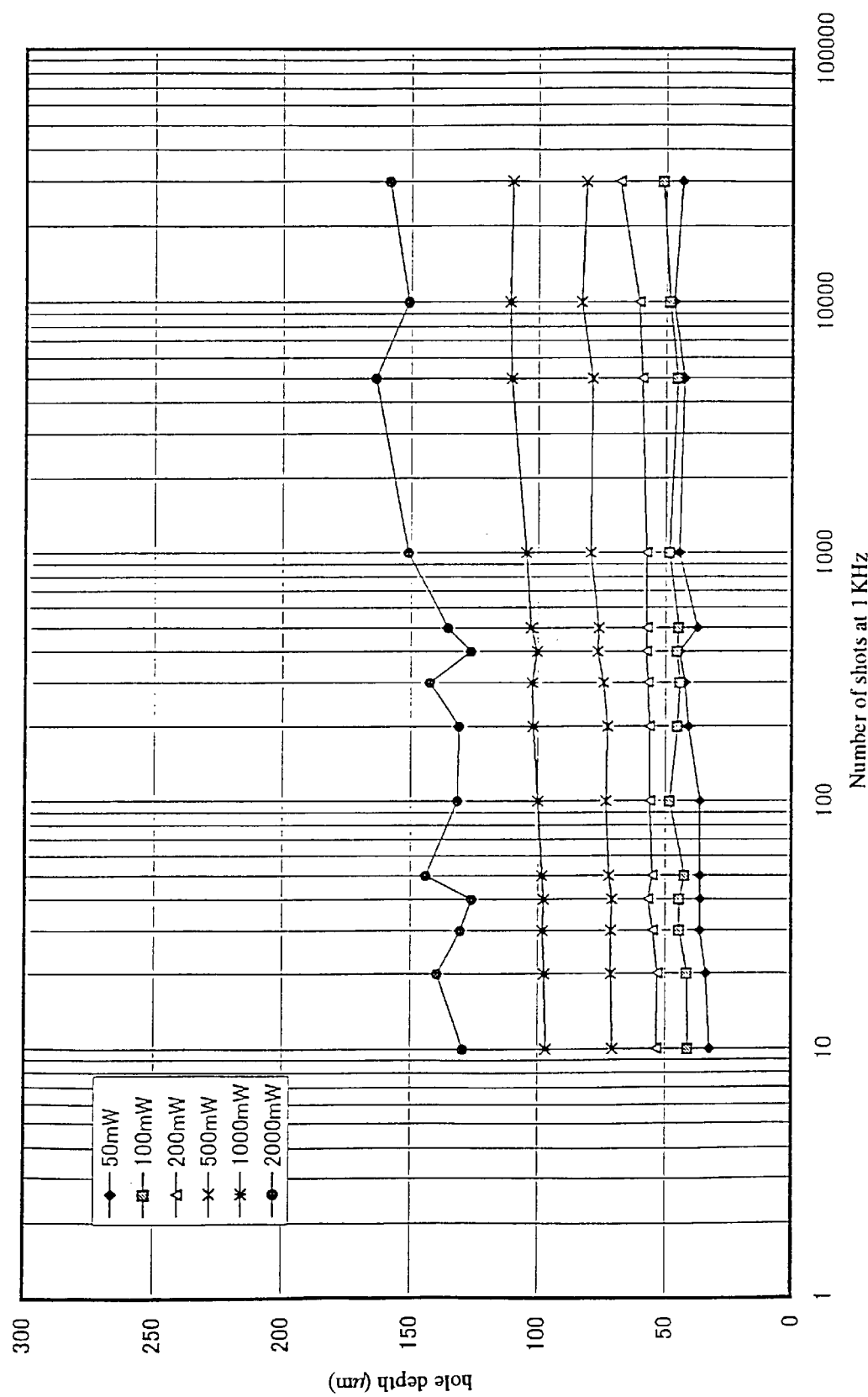

FIGS. 19 and 20 are characteristic diagrams in the case where a preholes were formed by laser beam irradiation. FIG. 19 shows the relation between the number of laser shots at 1 kHz and the depth of the holes with use of laser power (5 mW to 2000 mW) as a parameter. FIG. 20 shows the relation between the number of laser shots at 1 kHz and the width of the holes with use of laser power (5 mW to 2000 mW) as a parameter. It is apparent that a prehole of a high aspect ratio are obtained in either case. Incidentally, on this occasion, a Q switch YAG laser of second harmonic wave was used as a laser and a condensing lens f100 was used as an optical system.

EXAMPLE 2

The condition for etching in the case where the preholes were enlarged by anisotropic etching in Embodiment 1 is as follows.
<Etching Condition>
  Etching solution: KOH aqueous solution
  Concentration: 35% by weight
  Chemicals temperature: 80° C.
  Etching time: 1 hour (If the etching time is too short, a slender hole appears. If the etching time is too long, a (111) face appears as a whole.)
<Wafer Condition>
  Material: Si(100) (Crystalline silicon surface-oriented to a (100) face. The same expression applies hereunder.)
  Plate thickness: plate thickness 550 $\mu$m
  Incidentally, as the etching solution, the KOH aqueous solution may be replaced by an organic alkaline etching solution such as hydrazine, EPW (ethylenediamine-pyrocatechol-water), TMAH (tetramethylammonium hydroxide), or the like.

EXAMPLE 3

Figure 21:
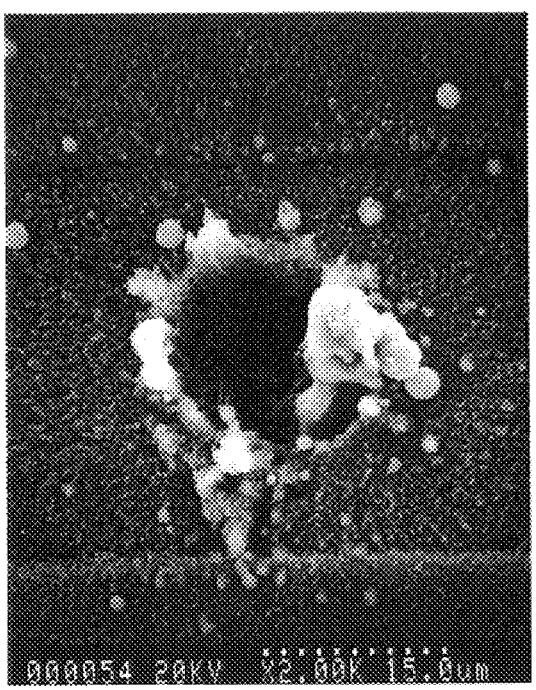
FIGS. 21A, 21B and 21C are enlarged diagrams of a laser beam incident plane, a laser beam exit plane and a hole-side section (a cut plane for observation) respectively in the case where the prehole is formed by laser beam irradiation as Example 3.
Figure 21:
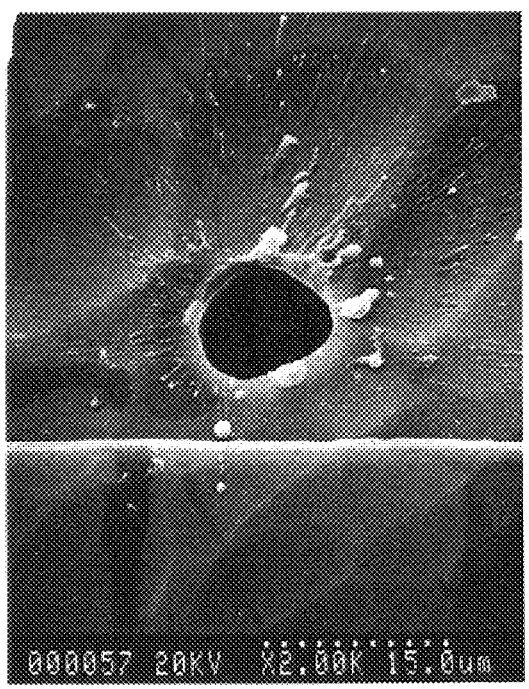
Figure 21:
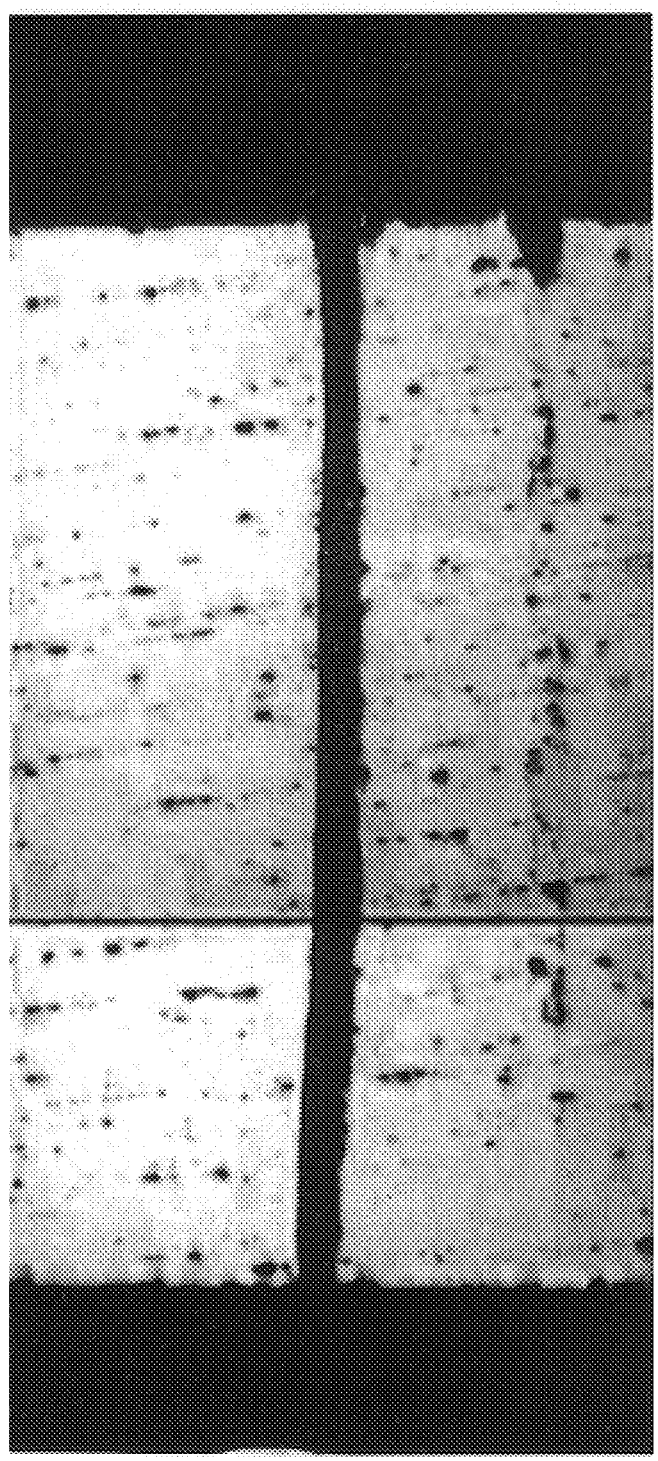

FIGS. 21A, 21B and 21C are enlarged diagrams of a laser beam incident plane, a laser beam exit plane and a hole-side section (a cut plane for observation) in the case where a prehole was formed by (circularly polarized) laser beam irradiation. Each of the laser beam incident plane in FIG. 21A and the laser beam exit plane in FIG. 21B was circular. Dross was produced in the neighborhood thereof. The prehole in FIG. 21C was excellent in linearity (plate thickness 550 $\mu$m). Incidentally, that which is shown in the lower portions of FIGS. 21A, 21B and 21C, for example, "×2.00K" in FIG. 21A and "×200" in FIG. 21C mean 2000 magnifications and 200 magnifications, respectively. Further, "15.0 $\mu$m" in FIG. 21A indicates the distance from the left end of dots denoted in the neighborhood thereof to the right end of the dots (In this example, the all dots' distance is 15 $\mu$m). The same applies to other drawings which will be described later.

EXAMPLE 4

Figure 22:
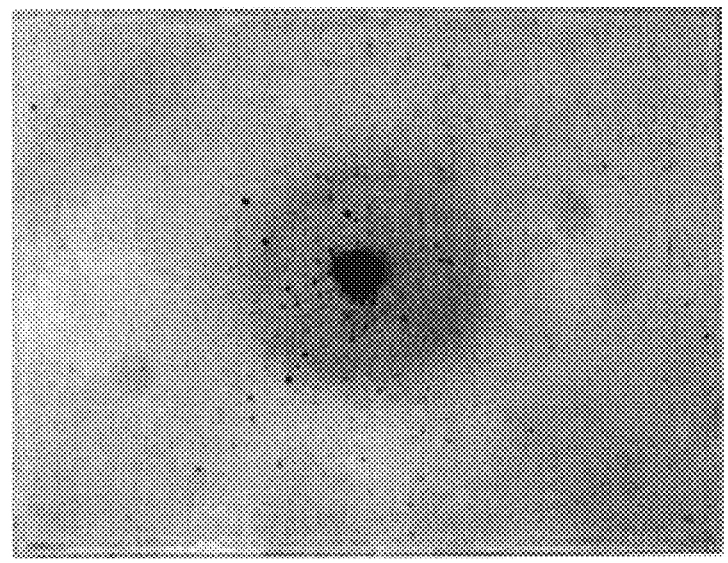
FIGS. 22A and 22B are diagrams showing states, before and after etching, of dross produced by laser beam irradiation as Example 4, respectively.
Figure 22:
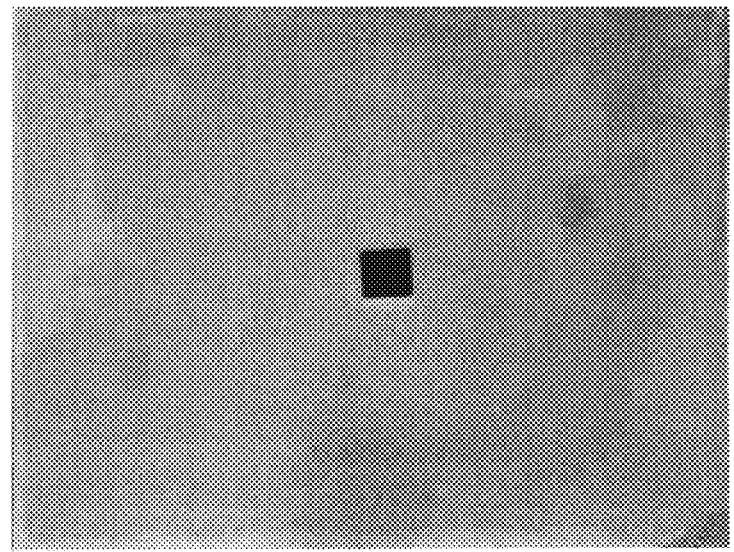

FIGS. 22A and 22B are diagrams showing the states, before and after etching, of dross which was produced in the case where a prehole was formed by laser beam irradiation (FIGS. 22A and 22B correspond to FIGS. 5(c) and (d)). It is apparent that dross was removed after etching.
<Laser Condition>
  Laser wavelength: 532 $\mu$m
  Condensing lens: f100 mm
  Lamp current: 28 A
<Processing Condition>
  Oscillation frequency: 1 kHz
  Power: 300 mW
  Number of shots: 300 shots
  Direction of linear polarization:
    lateral direction in the drawings (magnetic field)
<Wafer Condition>
  Material: Si(100)
  Plate thickness: 550 $\mu$m
  Surface state: containing an oxide film
<Etching Condition>
  Etching solution: KOH aqueous solution
  Concentration/temperature: 35%/80° C.
  Etching time: 1 hour

EXAMPLE 5

Figure 23:
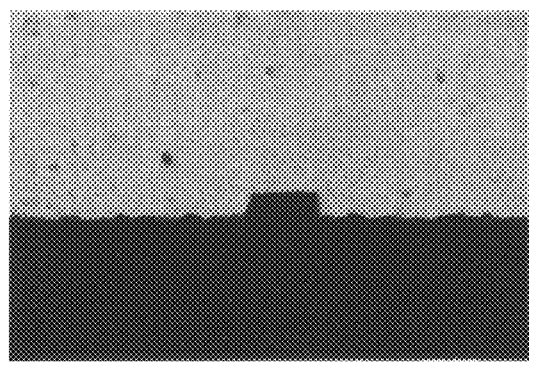
FIGS. 23A, 23B and 23C are diagrams showing an incident plane, a section (a cut plane for observation) and an exit plane, respectively, showing the states of processed holes after etching as Example 5.
Figure 23:
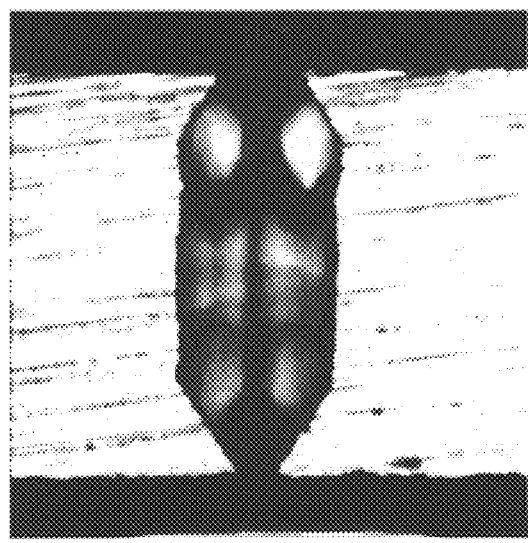
Figure 23:
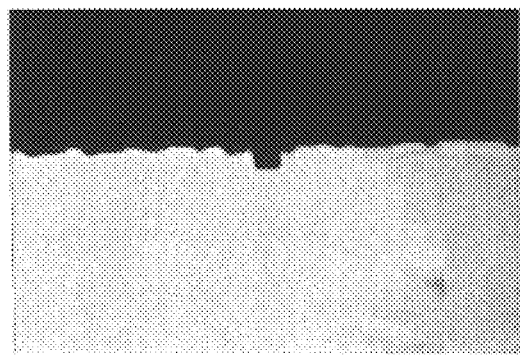

FIGS. 23A, 23B and 23C show an incident plane, a section (a cut plane for observation) and an exit plane, respectively, showing the state of a processed hole after etching. Specifications of the laser, etc. in this case are as follows.
<Laser Condition>
  Laser wavelength: 532 $\mu$m
  Condensing lens: f100 mm
  Lamp current: 28 A
<Processing Condition>
  Oscillation frequency: 1 kHz
  Power: 300 mW
  Number of shots: 300 shots
<Wafer Condition>
  Material: Si(100)
  Plate thickness: 550 $\mu$m
  Surface state: containing an oxide film
<Etching Condition>
  Etching solution: KOH aqueous solution
  Concentration/temperature: 35%/80° C.
  Etching time: 1 hour

EXAMPLE 6

In this example, the relation between the processing time for etching and the shape of the preholes were examined. Specifications of the laser, etc., in this case are as follows.

<Laser Condition>
Laser wavelength: 532 μm
Condensing lens: f100 mm
Lamp current: 28 A <Processing Condition>
Oscillation frequency: 1 kHz
Number of shots: 50, 500, 5000 shots <Wafer Condition>
Material: Si(100)
Plate thickness: 550 μm
Oxide film: 1.5 μm
Oxide film pattern: None <Etching Condition>
Etching solution: KOH aqueous solution
Concentration/temperature: 35%/80° C.

Figure 24:
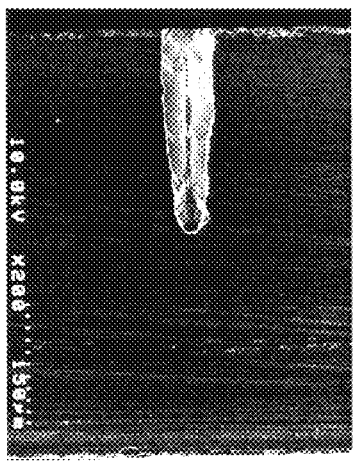
FIGS. 24A, 24B and 24C are diagrams showing sections (cut planes for observation), respectively, showing the states of preholes in the case where etching is applied to each prehole for 15 minutes as Example 6.
Figure 24:
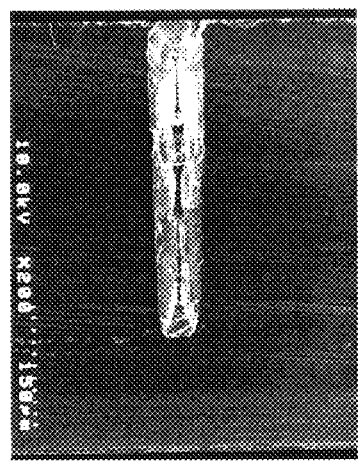
Figure 24:
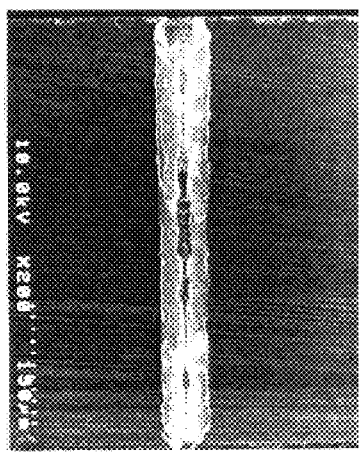

FIGS. 24A, 24B and 24C show sections (cut planes for observation), respectively, showing the states of respective preholes (the number of laser shots: 50, 500 and 5000) in the case where etching was applied for 15 minutes.

Figure 25:
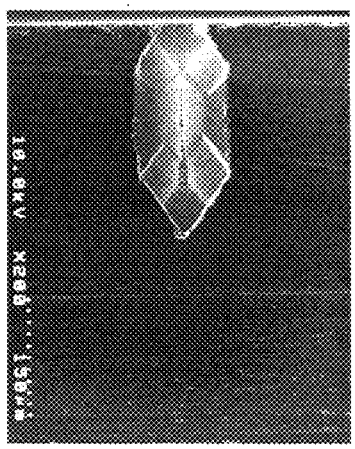
FIGS. 25A, 25B and 25C are diagrams showing sections (cut planes for observation), respectively, showing the states of preholes in the case where etching is applied to each prehole for 30 minutes as Example 6.
Figure 25:
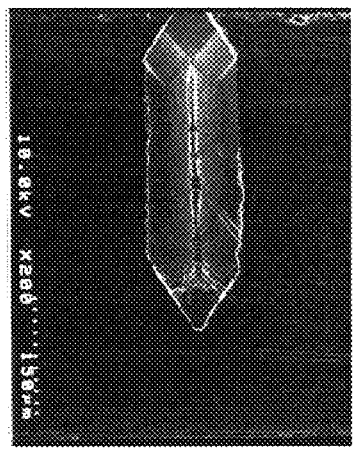
Figure 25:
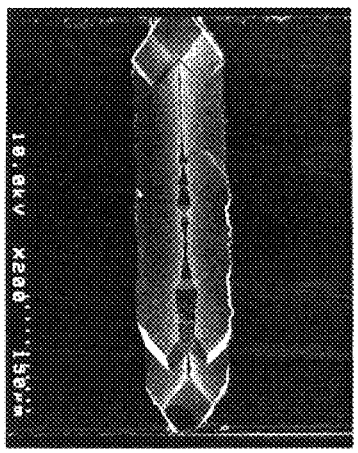

FIGS. 25A, 25B and 25C show sections (cut planes for observation), respectively, showing the states of respective preholes (the number of laser shots: 50, 500 and 5000) in the case where etching was applied for 30 minutes.

FIGS. 26A, 26B and 26C show sections (cut planes for observation), respectively, showing the states of respective preholes (the number of laser shots: 50, 500 and 5000) in the case where etching was applied for 60 minutes.

Figure 27:
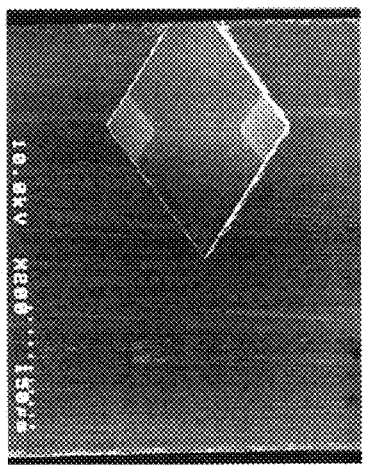
FIGS. 27A, 27B and 27C are diagrams showing sections (cut planes for observation), respectively, showing the states of preholes in the case where etching is applied to each prehole for 90 minutes as Example 6.
Figure 27:
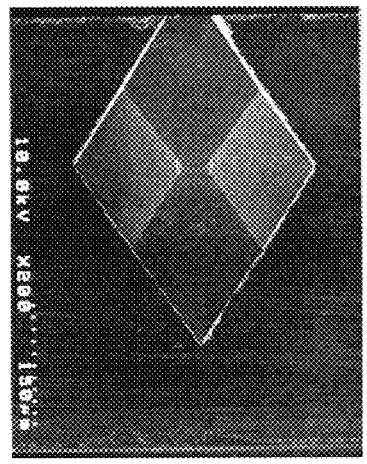
Figure 27:
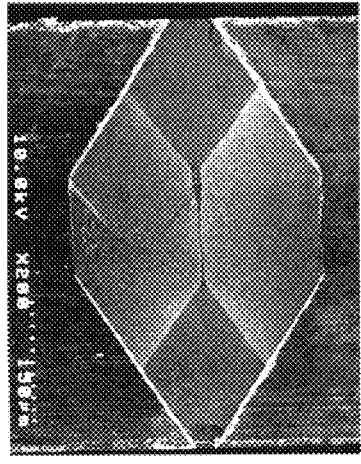

FIGS. 27A, 27B and 27C show sections (cut planes for observation), respectively, showing the states of respective preholes (the number of laser shots: 50, 500 and 5000) in the case where etching was applied for 90 minutes.

Figure 28:
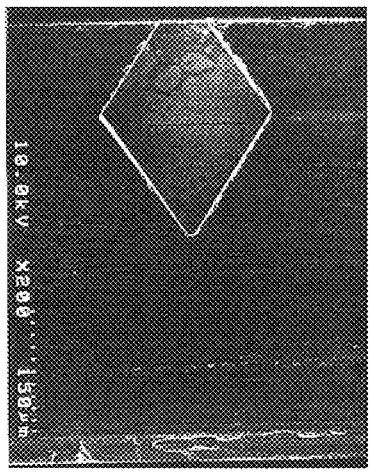
FIGS. 28A, 28B and 28C are diagrams showing sections (cut planes for observation), respectively, showing the states of preholes in the case where etching is applied to each prehole for 120 minutes as Example 6.
Figure 28:
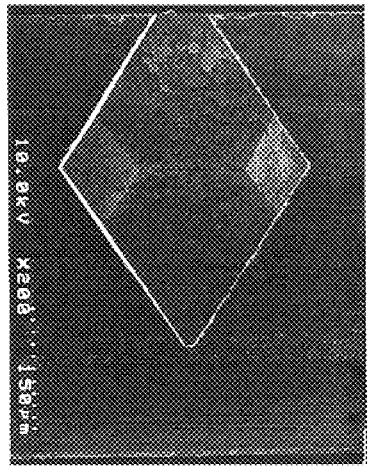
Figure 28:
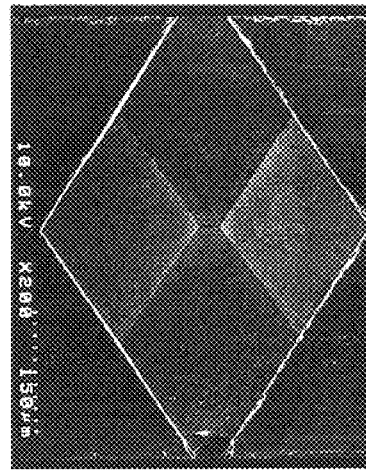

FIGS. 28A, 28B and 28C show sections (cut planes for observation), respectively, showing the states of respective preholes (the number of laser shots: 50, 500 and 5000) in the case where etching was applied for 120 minutes.

It is apparent from the aforementioned drawings that the shape of the preholes can be controlled by control of the etching time.

EXAMPLE 7

Figure 29:
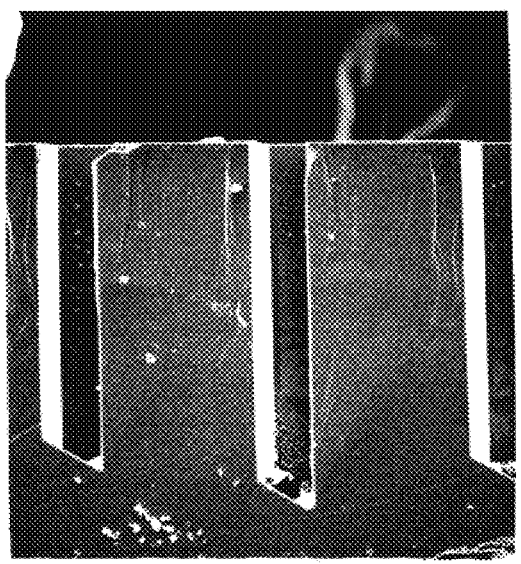
FIGS. 29A and 29B are diagrams showing sections (cut planes for observation), respectively, in the case where, after an oxide film is formed on a silicon substrate surface-oriented to a (110) face, the silicon substrate is irradiated with a laser beam and then etched.
Figure 29:
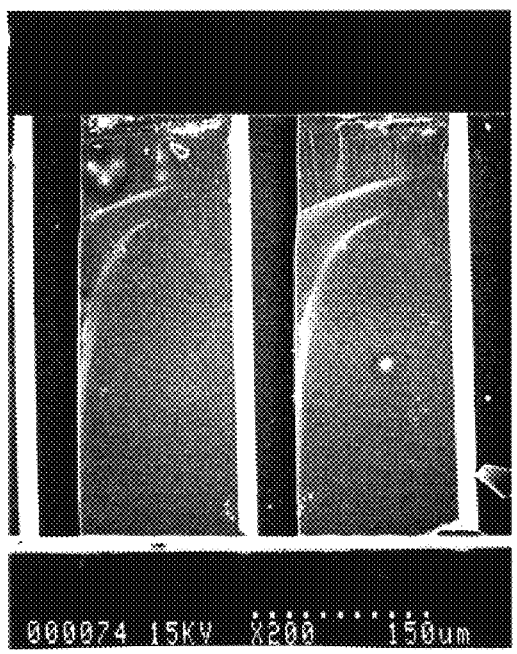

FIGS. 29A and 29B show sections (cut planes for observation) in the case where, after an oxide film was formed on a silicon substrate having a surface-orientation (110) face, the silicon substrate was irradiated with a laser beam and then etching was applied. FIG. 29A shows the case where etching was applied to blind holes through which no laser beam was passed yet. FIG. 29B shows the case where etching was applied to through-holes formed by the laser beam irradiation. In either case, a surface-orientation (111) face appears, so that a straight preholes are obtained.

EXAMPLE 8

An examplary case where oblique holes were formed by laser-processing will be described below in comparison with perpendicular holes.

Figure 30:
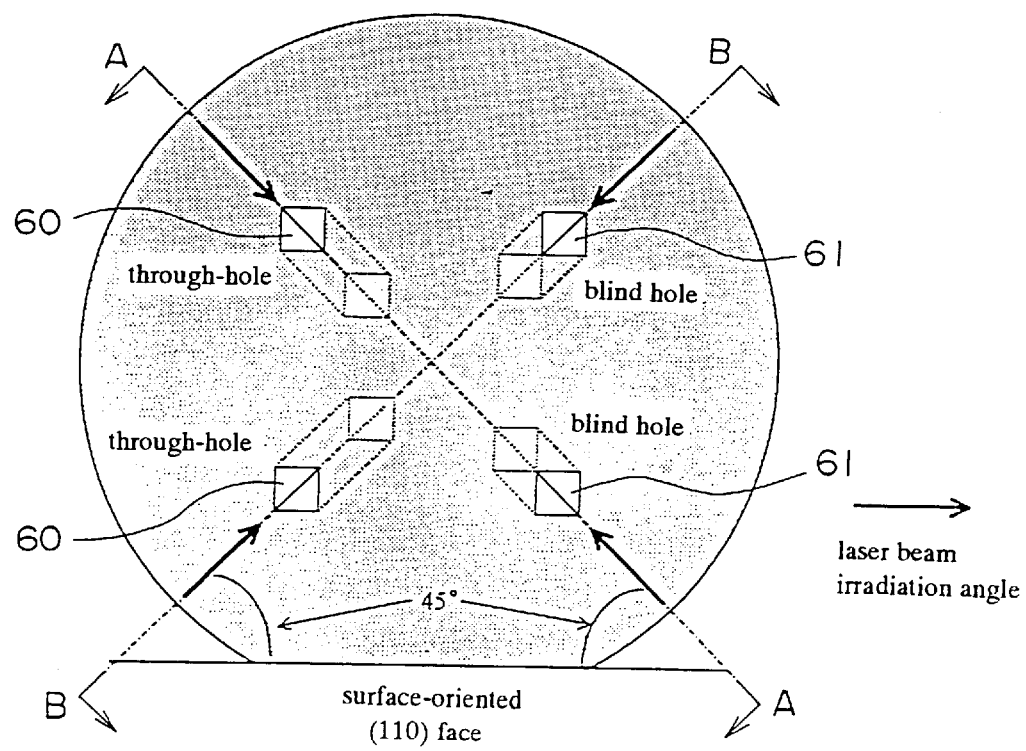
FIG. 30 is a plan view showing the case where holes inclined obliquely at 45 degrees are laser-processed and etched in a silicon substrate surface-oriented to a (100) face.
Figure 31:
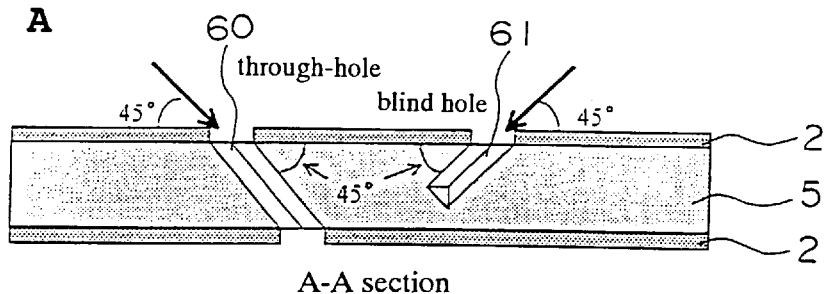
FIGS. 31A and 31B are sectional views taken along the lines A—A and B—B, respectively, in FIG. 30.
Figure 31:
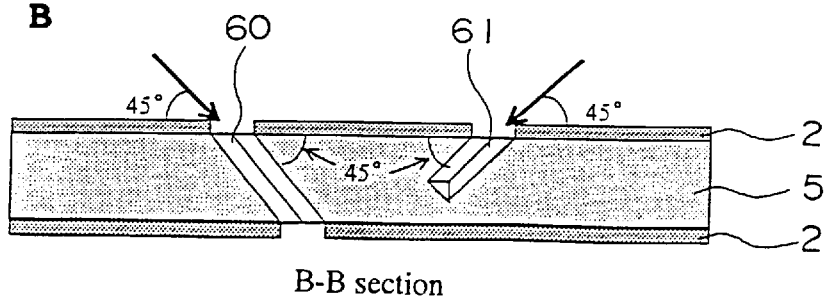

FIG. 30 is a plan view in the case where holes inclined obliquely at 45 degrees were formed by laser-processing in a silicon substrate 5 surface-oriented to a (100) face. FIG. 31A is a sectional view taken along the line A—A in FIG. 30. FIG. 31B is a sectional view taken along the line B—B in FIG. 30. Here is shown the shape in the case where a surface-orientation (111) face appeared and etching stopped.

Incidentally, in the drawings, a through-hole 60 and a blind hole (non-through-hole) 61 are shown as examples of the oblique holes.

Figure 32:
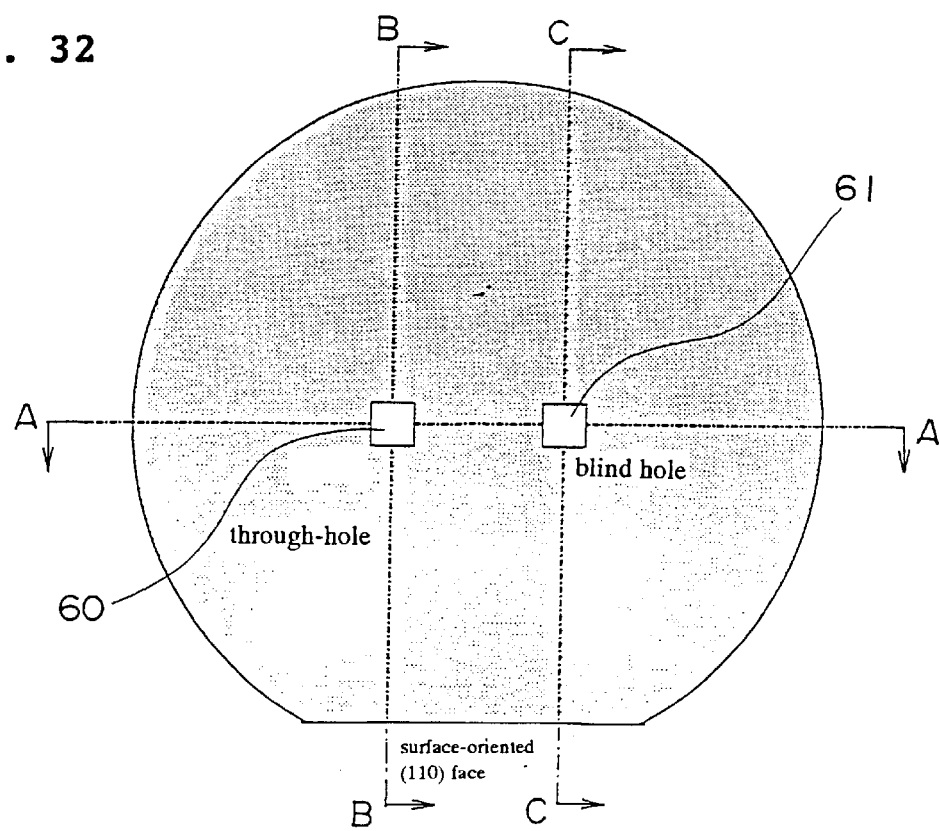
FIG. 32 is a plan view showing the case where perpendicular holes are laser-processed and etched in a silicon substrate surface-oriented to a (100) face.
Figure 33:
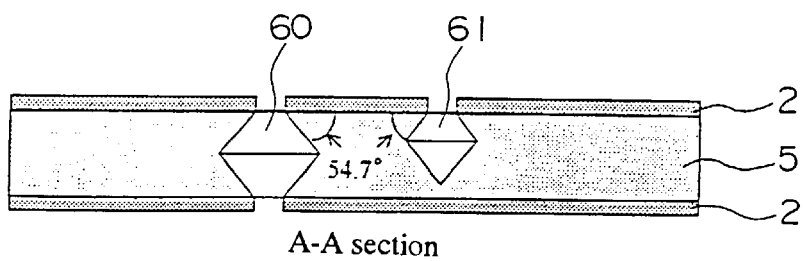
FIGS. 33A, 33B and 33C are sectional views taken along the lines A—A, B—B and C—C, respectively, in FIG. 32.
Figure 33:
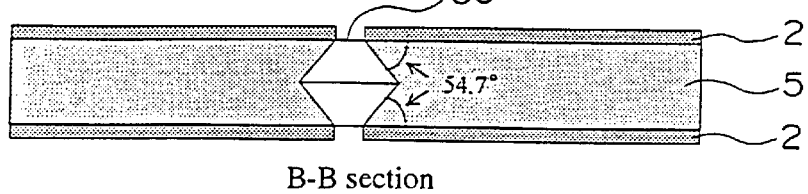
Figure 33:
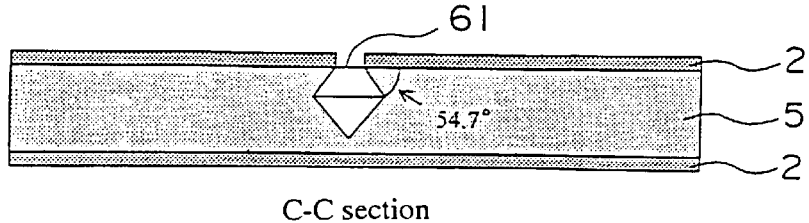

FIG. 32 is a plan view showing the case where perpendicular holes were laser-processed and etched in a silicon substrate 5 surface-oriented to a (100) face. FIG. 33A is a sectional view taken along the line A—A in FIG. 32. FIG. 33B is a sectional view taken along the line B—B in FIG. 32. FIG. 33C is a sectional view taken along the line C—C in FIG. 32. Here is also shown the shape in the case where a surface-orientation (111) face appeared and etching stopped.

Figure 34:
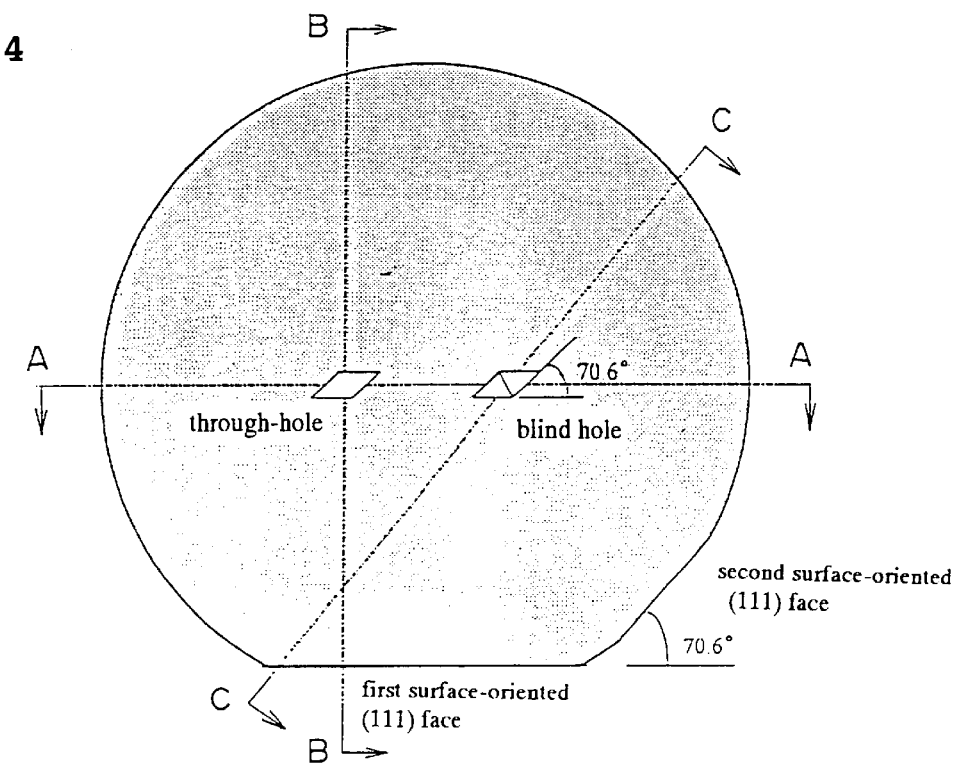
FIG. 34 is a plan view showing the case where perpendicular holes are laser-processed and etched in a silicon substrate surface-oriented to a (110) face.
Figure 35:
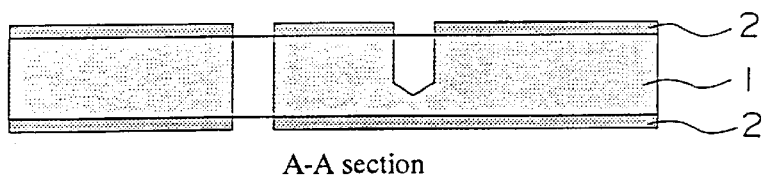
FIGS. 35A, 35B and 35C are sectional views taken along the lines A—A, B—B and C—C, respectively, in FIG. 34.
Figure 35:
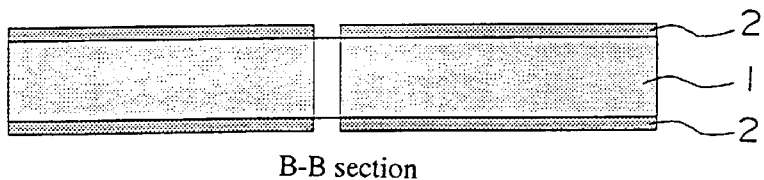
Figure 35:
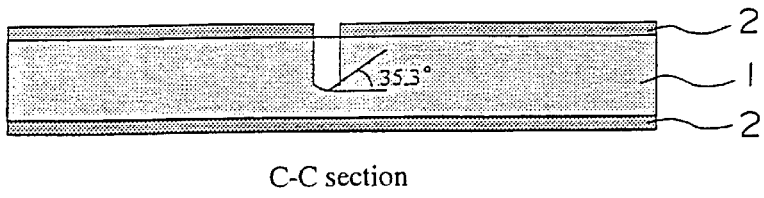

FIG. 34 is a plan view showing the case where perpendicular holes were laser-processed and etched in a silicon substrate 1 surface-oriented to a (110) face. FIG. 35A is a sectional view taken along the line A—A in FIG. 34. FIG. 35B is a sectional view taken along the line B—B in FIG. 34. FIG. 35C is a sectional view taken along the line C—C in FIG. 34. Here is also shown the shape in the case where a surface-orientation (111) face appeared and etching stopped.

Figure 36:
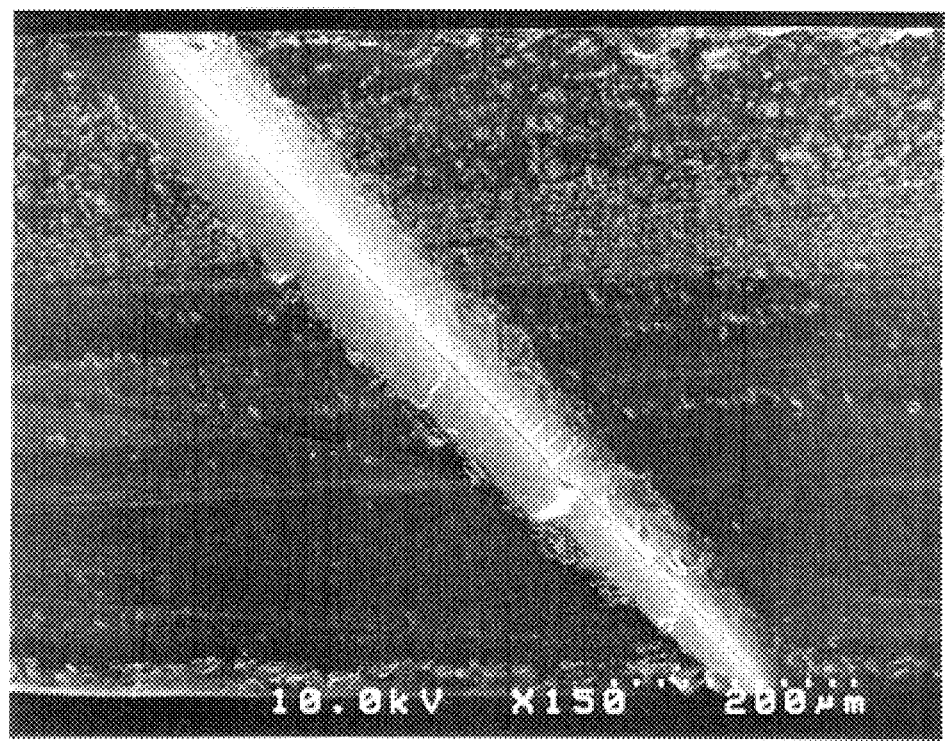
FIGS. 36 and 37 are diagrams showing sections (cut planes for observation) of a through-hole and a blind hole (non-through-hole), respectively.
Figure 37:
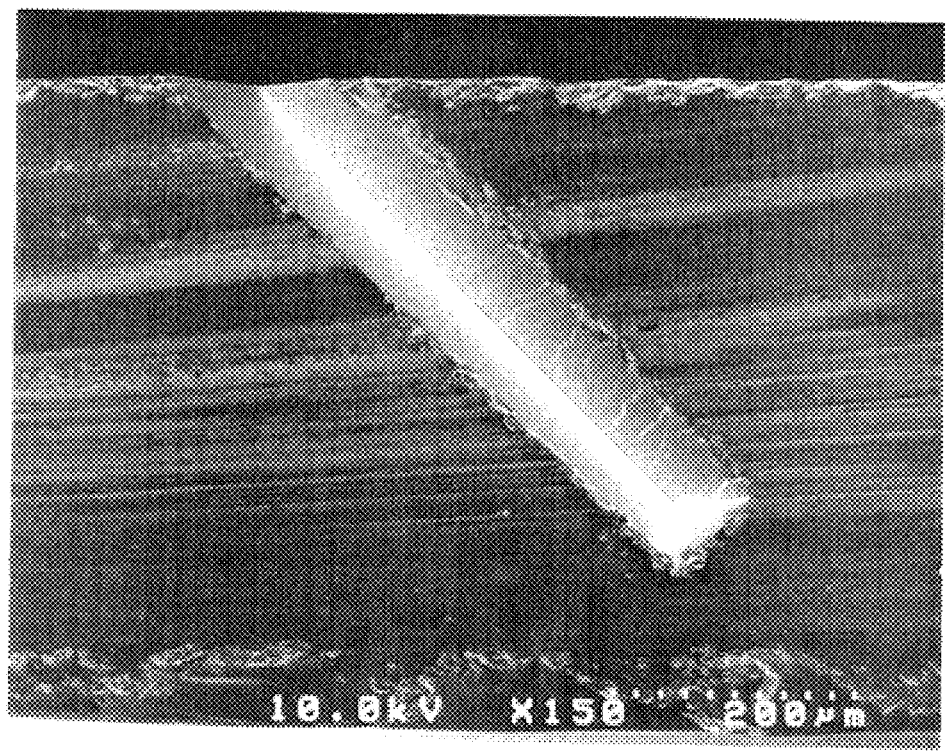

FIGS. 36 and 37 show sections (cut planes for observation) of a through-hole 60 and a blind hole (non-through-hole) 61 corresponding to FIG. 31A or 31B.

It is apparent from these drawings that the advantages described in Embodiment 7 are obtained when oblique holes are formed in a silicon substrate having a surface-orientation (100) face by laser-processing.

What is claimed is:

1. A semiconductor chip comprising:
    a crystalline substrate having a through-hole;
    an electrically insulating film formed on an inner wall of said through-hole;
    a metal bump containing an electrically conducting material inserted into said through-hole, for electrically connecting one surface of said crystalline substrate to the other surface of said crystalline substrate through said electrically conducting material; and
    an electrode pad formed on said one surface of said crystalline substrate through an electrically insulating film, wherein said metal bump protrudes from said one surface of said crystalline substrate while being electrically connected to said electrode pad and further protrudes from the other surface of said crystalline substrate while piercing said crystalline substrate.

2. A semiconductor chip according to claim 1, wherein said metal bump is formed in said through-hole which is formed to pierce said crystalline substrate in a range of from a portion of said electrode pad on said one surface of said crystalline substrate to the other surface of said crystalline substrate.

3. A semiconductor chip according to claim 2, wherein said metal bump is made of an electrically conducting material provided along said inner wall of said through-hole.

4. A semiconductor device, comprising:
    semiconductor chips each including:
        a crystalline substrate having a through-hole;
        an electrically insulating film formed on an inner wall of said-through-hole;
        a metal bump containing an electrically conducting material inserted into said through-hole, for electrically connecting one surface of said crystalline substrate to the other surface of said crystalline substrate through said electrically conducting material, wherein said semiconductor chips are laminated while said metal bumps of said semiconductor chips are respectively connected to one another; and
        an electrode pad formed on said one surface of said crystalline substrate through an electrically insulating film, wherein said metal bump protrudes from said one surface of said crystalline substrate while being electrically connected to said electrode pad and further protrudes from the other surface of said crystalline substrate while piercing said crystalline substrate.

5. A circuit substrate, comprising:
a semiconductor device, said semiconductor device including semiconductor chips each having:
a crystalline substrate having a through-hole;
an electrically insulating film formed on an inner wall of said through-hole;
a metal bump containing an electrically conducting material inserted into said through-hole, for electrically connecting one surface of said crystalline substrate to the other surface of said crystalline substrate through said electrically conducting material, wherein said semiconductor chips are laminated while said metal bumps of said semiconductor chips are respectively connected to one another; and
an electrode pad formed on said one surface of said crystalline substrate through an electrically insulating film, wherein said metal bump protrudes from said one surface of said crystalline substrate while being electrically connected to said electrode pad and further protrudes from the other surface of said crystalline substrate while piercing said crystalline substrate.

6. An electronic apparatus, comprising:
a circuit substrate containing a semiconductor device incorporated therein, said semiconductor device having semiconductor chips each having:
a crystalline substrate having a through-hole;
an electrically insulating film formed on an inner wall of said through-hole;
a metal bump containing an electrically conducting material inserted into said through-hole, for electrically connecting one surface of said crystalline substrate to the other surface of said crystalline substrate through said electrically conducting material, wherein said semiconductor chips are laminated while said metal bumps of said semiconductor chips are respectively connected to one another; and
an electrode pad formed on said one surface of said crystalline substrate through an electrically insulating film, wherein said metal bump protrudes from said one surface of said crystalline substrate while being electrically connected to said electrode pad and further protrudes from the other surface of said crystalline substrate while piercing said crystalline substrate.

7. A method of producing a semiconductor chip, comprising the steps of:
forming a prehole in a crystalline substrate by laser beam irradiation; and
enlarging said prehole by anisotropic etching to thereby form a through-hole.

8. A method of producing a semiconductor chip according to claim 7, further comprising the steps of:
forming an electrically insulating film on an inner wall of said through-hole; and
forming an electrically conducting material in said through-hole having said electrically insulated inner wall to thereby form a metal bump for electrically connecting one surface of said crystalline substrate to the other surface of said crystalline substrate.

9. A method of producing a semiconductor chip according to claim 7, wherein protective films are formed on one and the other surfaces of said crystalline substrate respectively so that said crystalline substrate is irradiated with a laser beam through said protective films.

10. A method of producing a semiconductor chip according to claim 7, wherein said substrate is irradiated with a laser beam split by a phase grating.

11. A method of producing a semiconductor chip according to any one of claim 7, wherein said substrate is irradiated with a laser beam converted into randomly polarized light.

12. A method of producing a semiconductor chip according to claim 7, wherein said crystalline substrate is irradiated with a circularly polarized laser beam.

13. A method of producing a semiconductor chip according to claim 8, wherein said leading hole is formed by laser beam irradiation at a portion of an electrode pad formed on said crystalline substrate, and said electrode pad and said metal bump are electrically connected to each other.

14. A method of producing a semiconductor chip according to claim 8 or 13, wherein said crystalline substrate is a silicon substrate.

15. A method of producing a semiconductor chip according to claim 14, wherein said silicon substrate is surface-oriented to a (100) face.

16. A method of producing a semiconductor chip according to claim 14, wherein said silicon substrate is surface-oriented to a (110) face.

17. A method of producing a semiconductor chip according to claim 9, wherein said crystalline substrate is irradiated with a laser beam from a surface of said crystalline substrate on which said electrode pad is formed.

18. A method of producing a semiconductor chip according to claim 9, wherein said crystalline substrate is irradiated with a laser beam from a surface of said crystalline substrate on which said electrode pad is formed, and from a surface of said crystalline substrate which is opposite to said surface on which said electrode pad is formed.

19. A method of producing a semiconductor chip according to claim 9, wherein said electrode pad having an opening portion in its center portion is covered with a protective film so that said laser beam is made to pass through said opening portion across said protective film.

20. A method of producing a semiconductor chip according to claim 17, wherein said crystalline substrate is irradiated with a laser beam from a surface of said crystalline substrate which is opposite to said surface on which said electrode pad is formed.

21. A method of producing a semiconductor chip according to claim 19, wherein a patterned protective film is formed between said electrode pad and a surface of said crystalline substrate so that the etching form by said anisotroptic etching is defined by the shape of said protective film.

22. A method of producing a semiconductor device, comprising the steps of:
producing semiconductor chips each by a production method including the steps of forming a prehole in a crystalline substrate by laser beam irradiation, enlarging said prehole by anisotropic etching to thereby form a through-hole, forming an electrically insulating film on an inner wall of said through-hole, and forming an electrically conducting material in said through-hole having the electrically insulated inner wall to thereby form a metal bump for electrically connecting one surface of said crystalline substrate to the other surface of said crystalline substrate; and
producing a semiconductor device by laminating said semiconductor chips on one another.

23. A method of producing a circuit substrate, comprising the steps of:
producing semiconductor chips each by a production method including the steps of forming a prehole in a crystalline substrate by laser beam irradiation, enlarging said prehole by anisotropic etching to thereby form a through-hole, forming an electrically insulating film on an inner wall of said through-hole, and forming an electrically conducting material in said through-hole having the electrically insulated inner wall to thereby form a metal bump for electrically connecting one surface of said crystalline substrate to the other surface of said crystalline substrate;

producing a semiconductor device by laminating said semiconductor chips on one another; and producing a circuit substrate having said semiconductor device incorporated therein.

24. A method of producing an electronic apparatus, comprising the steps of:

producing semiconductor chips each by a production method including the steps of forming a prehole in a crystalline substrate by laser beam irradiation, enlarging said prehole by anisotropic etching to thereby form a through-hole, forming an electrically insulating film on an inner wall of said through-hole, and forming an electrically conducting material in said through-hole having the electrically insulated inner wall to thereby form a metal bump for electrically connecting one surface of said crystalline substrate to the other surface of said crystalline substrate;

producing a semiconductor device by laminating said semiconductor chips on one another;

producing a circuit substrate having said semiconductor device incorporated therein; and producing an electronic apparatus having said circuit substrate mounted thereon.

* * * * *